(12) United States Patent
Lee et al.

(10) Patent No.: US 8,173,270 B2
(45) Date of Patent: May 8, 2012

(54) CONDUCTING POLYMER COMPOSITION AND ORGANIC OPTOELECTRONIC DEVICE EMPLOYING THE SAME

(75) Inventors: Tae-Woo Lee, Seoul (KR); Jong-Jin Park, Yongin-si (KR); Joon-Yong Park, Yongin-si (KR); Mu-Gyeom Kim, Hwaseong-si (KR); Dal-Ho Huh, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 851 days.

(21) Appl. No.: 11/651,081

(22) Filed: Jan. 9, 2007

(65) Prior Publication Data
US 2007/0176174 A1    Aug. 2, 2007

(30) Foreign Application Priority Data
Jan. 27, 2006    (KR) .................. 10-2006-0009007

(51) Int. Cl.
*H01L 51/54*    (2006.01)
(52) U.S. Cl. ........ 428/690; 428/917; 313/504; 313/506; 257/E51.036
(58) Field of Classification Search .................. None
See application file for complete search history.

(56) References Cited

U.S. PATENT DOCUMENTS

| | | | | |
|---|---|---|---|---|
| 3,282,875 | A | * | 11/1966 | Connolly et al. ............. 524/795 |
| 6,025,092 | A | * | 2/2000 | Doyle et al. .................. 429/213 |
| 6,416,885 | B1 | * | 7/2002 | Towns et al. .................. 428/690 |
| 2004/0206942 | A1 | * | 10/2004 | Hsu ............................... 252/500 |

OTHER PUBLICATIONS

Park et al. J. Appl. Polym. Sci. 1990, 40, 1487-1498. Year of publicaiton: 1990.*
Chen et al. Radiation Physics and Chemistry 2004, 69, 129-135. Year of publication: 2004.*
Woo Jin Bae et al., "A novel water-soluble and self-doped conducting polyaniline graft copolymer", Chem. Commun., 2003, pp. 2768-2769.
Woo Jin Bae et al., "A Water-Soluble and Self-Doped Conducting Polypyrrole Graft Copolymer", Macromolecules 2005, 38, pp. 1044-1047.

* cited by examiner

*Primary Examiner* — Lynda Salvatore
*Assistant Examiner* — Andrew K Bohaty
(74) *Attorney, Agent, or Firm* — Robert E. Bushnell, Esq.

(57) ABSTRACT

A conducting polymer, the conducting polymer composition further including an ionomer, and an organic optoelectronic device including the conducting polymer or the composition are provided. The conducting polymer according to the embodiments of the present invention is a self-doped conducting polymer in which conducting polymer chains are grafted in a polyacid. The conducting polymer composition to the present invention is manufactured by blending the self-doped conducting polymer with an ionomer having a physical cross-linking property thereto, and thus they are homogeneously dissolved in water or organic solvents. The conducting polymer and the composition have a good film-forming property and can be easily blended with other organic polymers, and conductivity and a work function thereof is easily controlled according to the content of the ionomer. Also, optoelectronic devices including the conducting polymer composition have high efficiency and a long lifetime.

31 Claims, 3 Drawing Sheets

CONDUCTING POLYMER COMPOSITION AND ORGANIC OPTOELECTRONIC DEVICE EMPLOYING THE SAME

CLAIM OF PRIORITY

This application claims the benefit of Korean Patent Application No. 10-2006-0009007, filed on Jan. 27, 2006, in the Korean Intellectual Property Office, the disclosure of which is incorporated herein in its entirety by reference.

BACKGROUND OF THE INVENTION

1. Field of the Invention

The present invention relates to a conducting polymer composition and an organic optoelectronic device including the same. More particularly, the present invention relates to a conducting polymer composition which is manufactured using a self-doped conducting polymer in which a conducting polymer chain is grafted in a polyacid, and is uniformly dissolved in water or an organic solvent, thereby having a good coating property and being easily blended with other organic polymers, and in which conductivity and a work function can be easily controlled according to the content of an additionally added ionomer, and to an organic optoelectronic device having high efficiency and a long lifetime.

2. Description of the Related Art

Optoelectronic devices convert light energy into electric energy or electric energy into light energy, and examples thereof include organic light emitting devices, solar cells, transistors, and the like. At present, many studies regarding the formation of conducting polymer films on the electrodes are being conducted to improve device efficiency by efficiently transporting electronic charges, that is, holes and electrons generated from the electrodes of an optoelectronic device into the optoelectronic active layers.

In particular, an organic light emitting device is an active light-emitting device in which electrons and holes combine in a fluorescent or phosphorescent organic compound thin film (hereinafter referred to as an organic film) when current is supplied to the organic film, thereby emitting light. In order to improve the efficiency of the organic light emitting device and reduce a driving voltage, the organic light emitting device generally has a multi-layer structure including a hole injection layer, an emissive layer, and an electron injection layer, etc., instead of single-layer structure only using an emitting layer. The hole injection layer can be formed using a conducting polymer.

In particular, an aqueous PEDOT (poly(3,4-ethylene dioxythiophene))-PSS (poly(4-styrenesulfonate)) dispersion, which is commercially available as Baytron P series products from H. C. Starck, GmbH, Germany, is widely used in the manufacture of an organic light-emitting device to form a hole injection layer by spin coating it on an ITO (indium tin oxide) electrode. The PEDOT-PSS, a hole injection material, has the following structure:

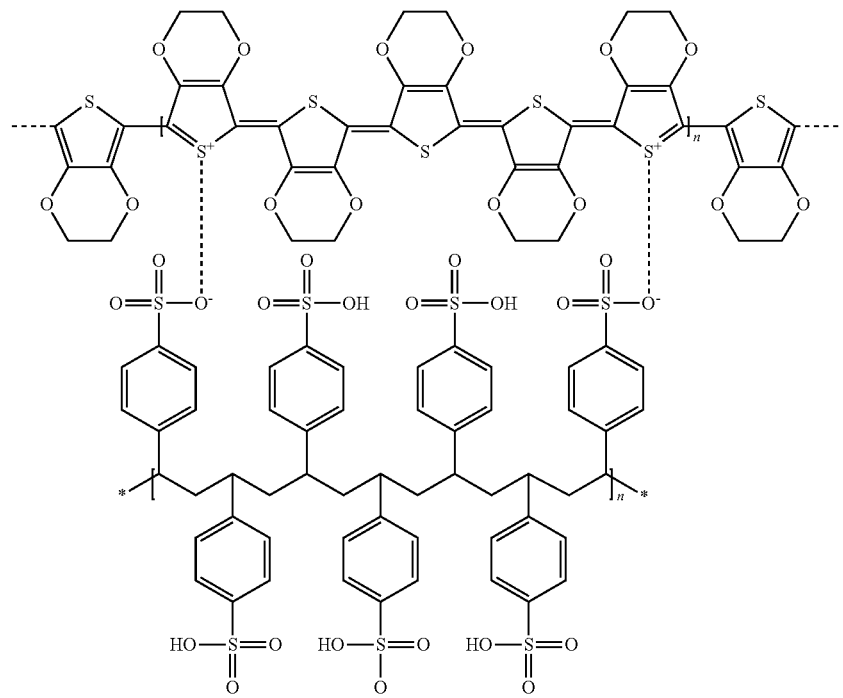

As above, a conducting polymer composition of PEDOT/PSS in which a polyacid of PSS (poly(4-styrenesulfonate)) is doped in a conducting polymer of PEDOT (poly(3,4-ethylene dioxythiophene)) is polymerized as a PEDOS/PSS composition by dissolving EDOT monomer in an aqueous PSS solution. However, the polymerized PEDOT/PSS composition has a particle size of more than 50 nm and exists in a dispersed state on a surface of water, and thus differences in conductivity, hole injection capability in OLED and thin film uniformity are significant according to the particle size. Besides, the resultant dispersions with PEDOT/PSS change its characteristics in each batch, and as a result, this incurs differences in the OLED device's performance.

Also, it is not recommended to use PSS because PSS in a PEDOT/PSS composition absorbs moisture well when a removal of moisture is required. Further, PSS can be decomposed by reaction with electrons to release a by-product such as sulfate, which may be diffused to an adjacent organic film, for example, an emissive layer. This diffusion of the material derived from the hole injection layer to the emissive layer induces exciton quenching, thereby resulting in a reduction in the efficiency and lifetime of the organic light emitting device.

Thus, a demand for a novel conducting polymer composition is increasing to obtain satisfactory device efficiency and lifetime in an optoelectronic device such as an organic light emitting device.

SUMMARY OF THE INVENTION

The present invention provides a conducting polymer and the composition which is uniformly dissolved in water or an organic solvent, thereby having a good coating property and being easily blended with other organic polymers, and conductivity and a work function of which is easily controlled according to the content of an ionomer additionally added.

The present invention also provides a conducting thin film formed from the conducting polymer composition.

The present invention further provides an optoelectronic device having high efficiency and a long lifetime by employing the thin film of the conducting polymer.

According to an aspect of the present invention, there is provided a conducting polymer having a repeating unit represented by Formula 1 below and a degree of polymerization of 10 to 10,000,000 comprising

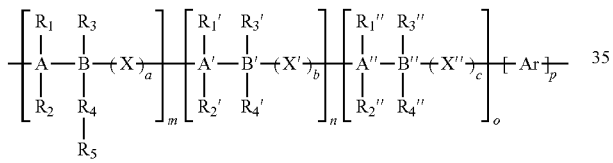

[Formula 1]

where $0<m<10,000,000$, $0<n<10,000,000$, $0\leq o<10,000,000$, $0\leq p<10,000,000$, $0\leq a\leq 20$, $0\leq b\leq 20$, $0\leq c\leq 20$;

each of A, B, A', B', A", and B" is independently selected from the group consisting of C, Si, Ge, Sn, and Pb;

each of $R_1$, $R_2$, $R_3$, $R_1'$, $R_2'$, $R_3'$, $R_4'$, $R_1''$, $R_2''$, $R_3''$, and $R_4''$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 alkylaryl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C6-C30 heteroarylester group;

at least one of $R_1$, $R_2$, $R_3$, $R_1'$, $R_2'$, $R_3'$ and $R_4'$ is an ionic group or includes an ionic group;

each of $R_4$, X, X', and X" is independently selected from the group consisting of a single bond, O, S, a substituted or unsubstituted C1-C30 alkylene group, a substituted or unsubstituted C1-C30 iminoalkylene group, a substituted or unsubstituted C1-C30 heteroalkylene group, a substituted or unsubstituted C6-C30 arylene group, a substituted or unsubstituted C6-C30 iminoarylene group, a substituted or unsubstituted C6-C30 arylalkylene group, a substituted or unsubstituted C6-C30 alkylarylene, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group, and a substituted or unsubstituted C6-C30 heteroarylester group;

$R_5$ is selected from the group consisting of polyaniline, polypyrrole, polyethylenedioxythiophene, polythiophene, polyphenylene, polyacetylene, polyphenylenevinylene and derivatives thereof having a degree of polymerization of 2 to 10,000,000; and Ar is selected from structural formulas represented by Formulas 1A through AA;

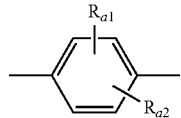

[Formula 1A]

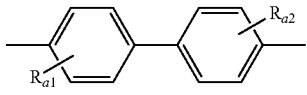

[Formula 1B]

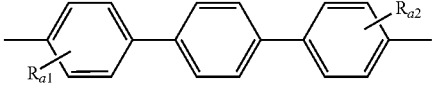

[Formula 1C]

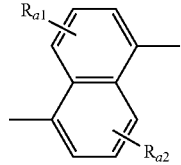

[Formula 1D]

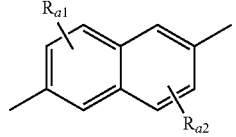

[Formula 1E]

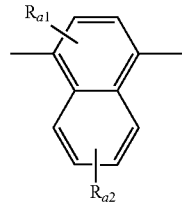

[Formula 1F]

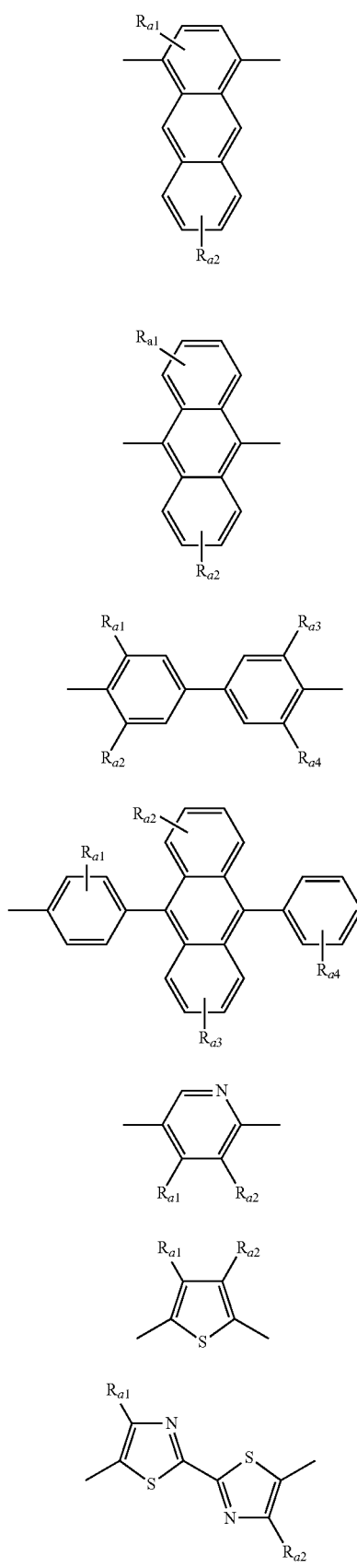
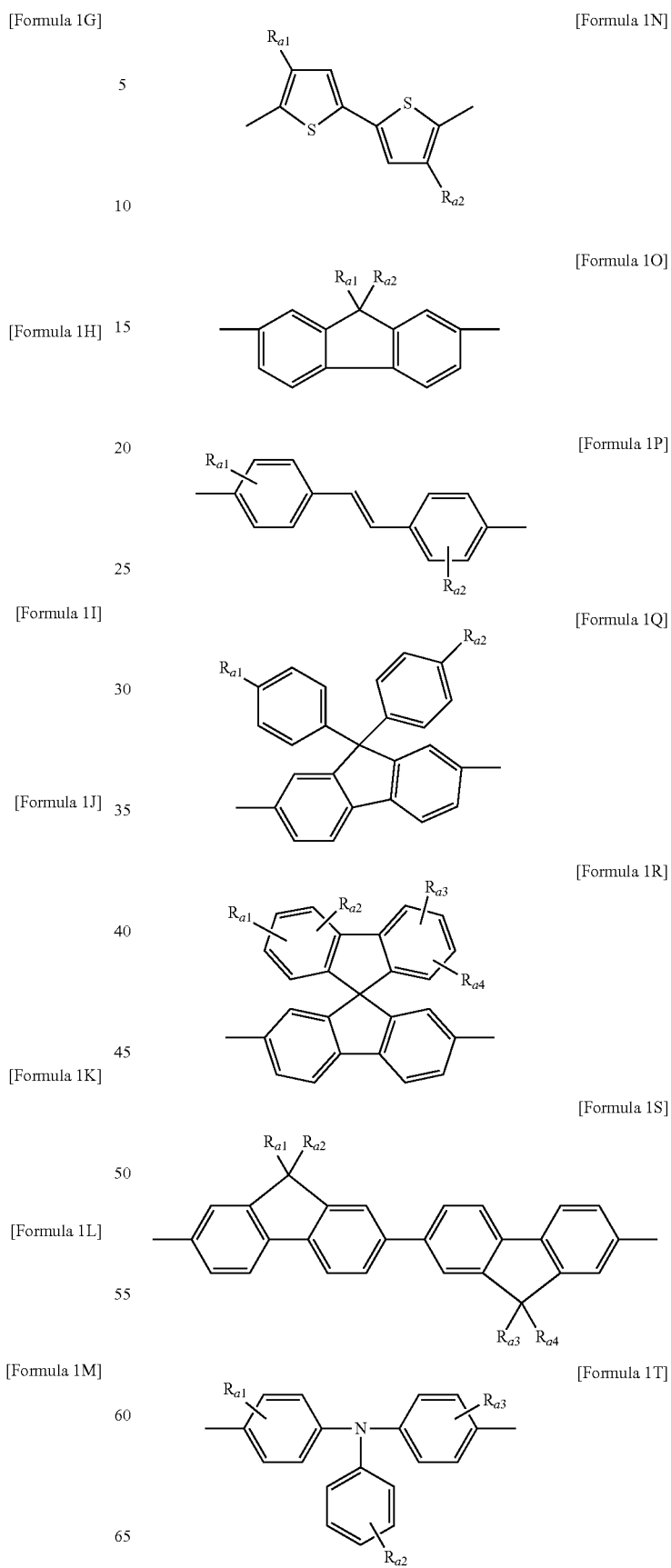

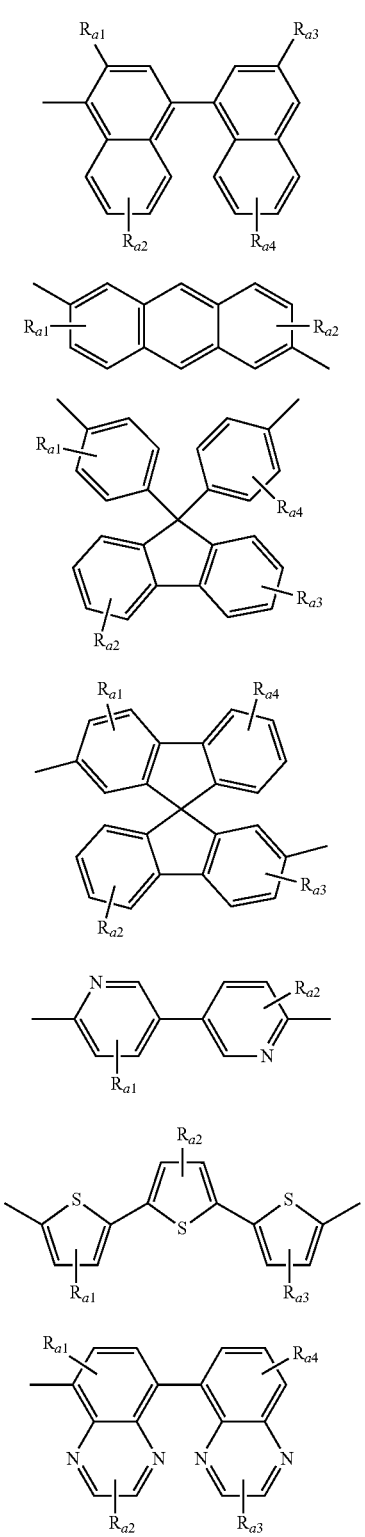

where each of $R_{a1}$, $R_{a2}$, $R_{a3}$ and $R_{a4}$ is independently a hydrogen atom, an alkyl group having 1-12 carbon atoms, an alkoxy group having 1-12 carbon atoms, and an aryl group having 6-20 carbon atoms, or each of —N(R')(R")(R') and R" is independently a hydrogen atom or an alkyl group having 1-12 carbon atoms; and at least one of $R_{a1}$, $R_{a2}$, $R_{a3}$ and $R_{a4}$ is an ionic group or includes an ionic group.

Also, according to another embodiment of the present invention, there is provided a conducting polymer composition including a repeating unit represented by Formula 1 above and a degree of polymerization of 10 to 10,000,000.

Also, according to another embodiment of the present invention, there is provided a conducting thin film formed by the conducting polymer and the composition.

Also, according to still another embodiment of the present invention, there is provided an optoelectronic device including the conducting thin film formed by the conducting polymer and the composition.

According to another aspect of the present invention, there is provided an organic light emitting device, including: a first electrode; a second electrode; and an organic layer interposed between the first electrode and the second electrode, the organic layer comprising an electric charge injection layer formed of the conducting polymer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
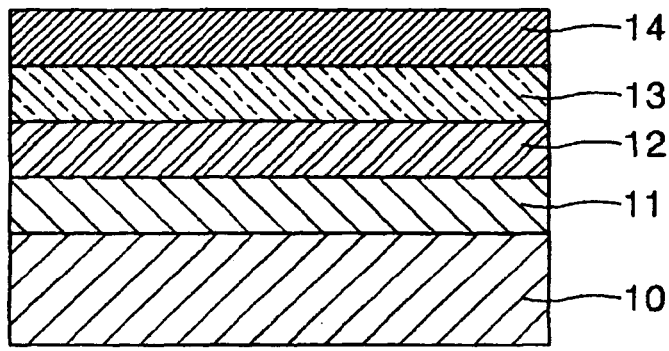
FIGS. 1A through 1D are diagrams illustrating a general structure of an organic light emitting device.

Hereinafter, the present invention will be described in detail.

According to an embodiment of the present invention, there is provided a conducting polymer having a repeating unit represented by Formula 1 below and a degree of polymerization of 10 to 10,000,000 comprising:

[Formula 1]

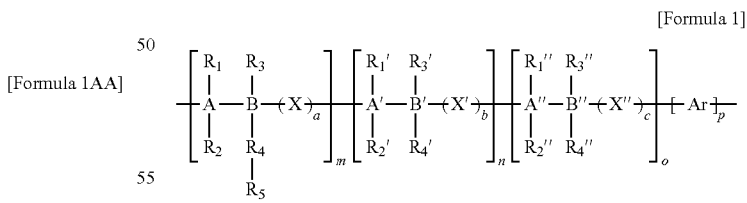

where $0 < m < 10,000,000$, $0 < n < 10,000,000$, $0 \leq o < 10,000,000$, $0 \leq p < 10,000,000$, $0 \leq a \leq 20$, $0 \leq b \leq 20$, $0 \leq c \leq 20$;

each of A, B, A', B', A", and B" is independently selected from the group consisting of C, Si, Ge, Sn, and Pb;

each of $R_1$, $R_2$, $R_3$, $R_1'$, $R_2'$, $R_3'$, $R_4'$, $R_1''$, $R_2''$, $R_3''$, and $R_4''$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 alkylaryl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C6-C30 heteroarylester group;

at least one of $R_1, R_2, R_3, R_1', R_2', R_3'$ and $R_4'$ is an ionic group or includes an ionic group;

each of $R_4, X, X'$, and $X''$ is independently selected from the group consisting of a single bond, O, S, a substituted or unsubstituted C1-C30 alkylene group, a substituted or unsubstituted C1-C30 iminoalkylene group, a substituted or unsubstituted C1-C30 heteroalkylene group, a substituted or unsubstituted C6-C30 arylene group, a substituted or unsubstituted C6-C30 iminoarylene group, a substituted or unsubstituted C6-C30 arylalkylene group, a substituted or unsubstituted C6-C30 alkylarylene, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group, and a substituted or unsubstituted C6-C30 heteroarylester group;

$R_5$ is selected from the group consisting of polyaniline, polypyrrole, polyethylenedioxythiophene, polythiophene, polyphenylene, polyacetylene, polyphenylenevinylene and derivatives thereof having a degree of polymerization of 2 to 10,000,000; and Ar is selected from structural formulas represented by Formulas 1A through 1AA;

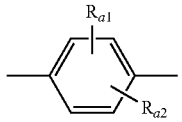

[Formula 1A]

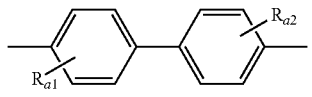

[Formula 1B]

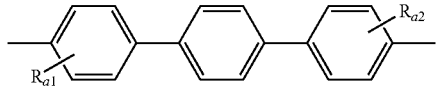

[Formula 1C]

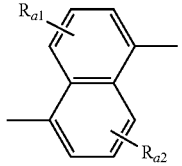

[Formula 1D]

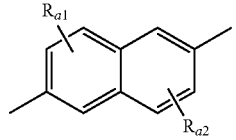

[Formula 1E]

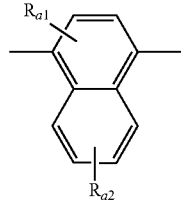

[Formula 1F]

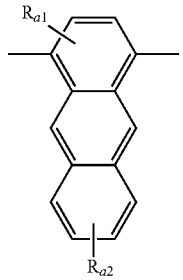

[Formula 1G]

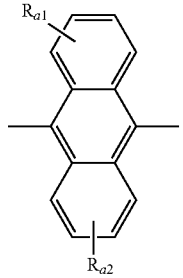

[Formula 1H]

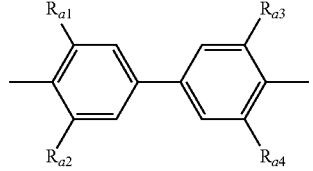

[Formula 1I]

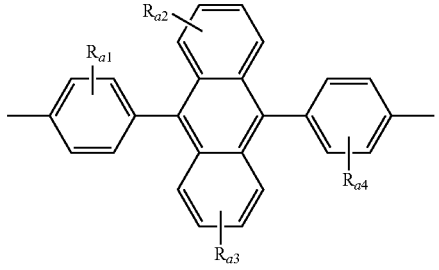

[Formula 1J]

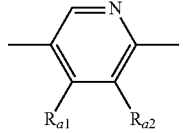

[Formula 1K]

[Formula 1L]
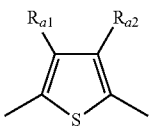
[Formula 1M]
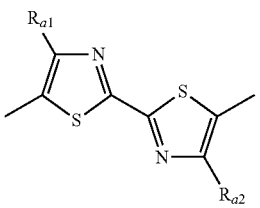
[Formula 1N]
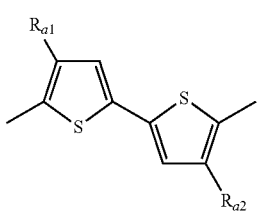
[Formula 1O]
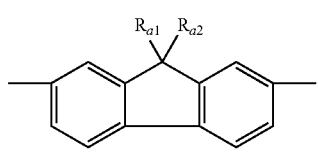
[Formula 1P]
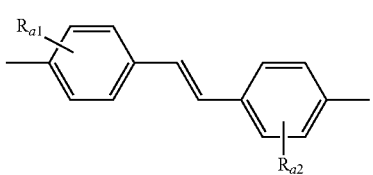
[Formula 1Q]
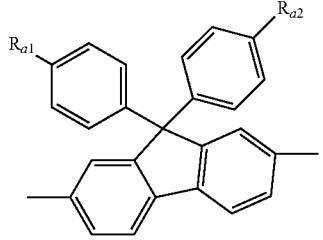
[Formula 1R]
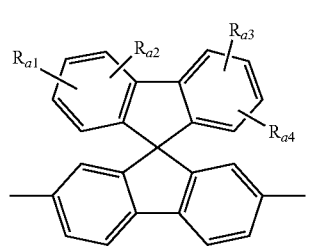
[Formula 1S]
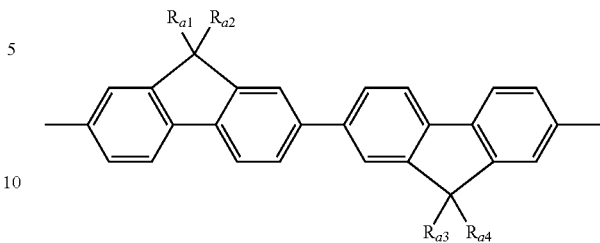
[Formula 1T]
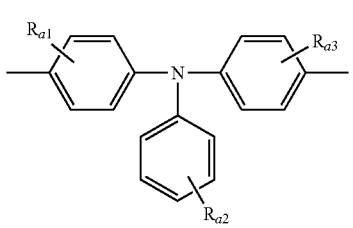
[Formula 1U]
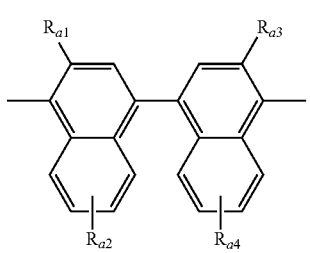
[Formula 1V]
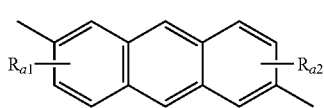
[Formula 1W]
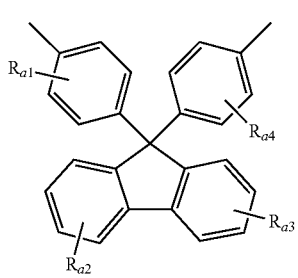
[Formula 1X]
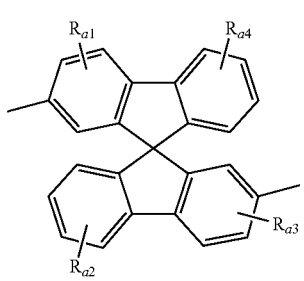

[Formula 1Y]

[Formula 1Z]

[Formula 1AA]

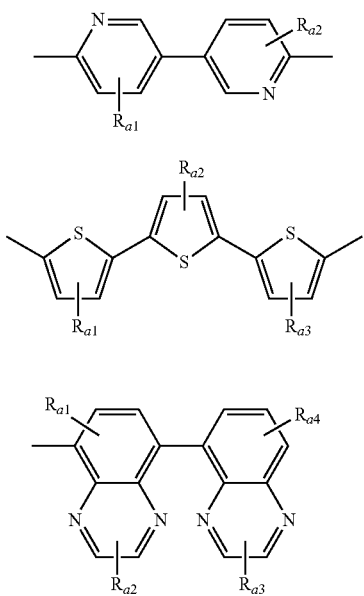

where each of $R_{a1}$, $R_{a2}$, $R_{a3}$ and $R_{a4}$ is independently a hydrogen atom, an alkyl group having 1-12 carbon atoms, an alkoxy group having 1-12 carbon atoms, and an aryl group having 6-20 carbon atoms, or each of —N(R')(R")(R') and R" is independently a hydrogen atom or an alkyl group having 1-12 carbon atoms; and at least one of $R_{a1}$, $R_{a2}$, $R_{a3}$ and $R_{a4}$ is an ionic group or includes an ionic group.

The conducting polymer according to the current embodiment of the present invention includes an ionic group, that is, is a self-doped conducting polymer in which the conducting polymer is grafted in side chains of ionomer, and can be represented by Formula 1.

The conducting polymer according to the current embodiment of the present invention includes at least one ionic group, and kinds of which are the same or different.

If $0<o<10,000,000$, the conducting polymer according to the current embodiment of the present invention has a copolymer form with a nonionic monomer unit having no ionic group, thereby reducing the content of ionic groups in the conducting polymer to an appropriate range and finally reducing the content of the residue decomposed by reaction with electrons. The content of the nonionic comonomer may be 0.1 to 99 mol % (i.e., $0.001<o/(m+n+o+p)<0.99$), preferably 1 to 50 mol % (i.e., $0.01<o/(m+n+o+p)<0.5$), based on 100 mol % of total monomers. When the content of the nonionic comonomer is less than 0.1 mol %, the function of the nonionic group cannot be sufficiently carried out. When the content of the nonionic comonomer is greater than 99 mol %, doping cannot be sufficiently achieved due to a low content of the ionic group.

When o=0, the conducting polymer according to the current embodiment of the present invention has a copolymer form having no nonionic monomer, thereby having a greater hygroscopicity than when a nonionic monomer is included. Accordingly, when the conducting polymer does not additionally include a nonconductive ionomer, at least one fluorine atom should be included in $R_1$, $R_2$, $R_3$, $R_4$, $R_5$, $R_1'$, $R_2'$, $R_3'$, and/or $R_4'$, and thus hydrophilicity can be reduced. The m, which refers to the content of conductive moiety including a grafted conducting polymer, may be 0.1 to 99 mol % (i.e., $0.001<m/(m+n+p)<0.99$), preferably 1 to 50 mol % (i.e., $0.01<m/(m+n+p)<0.5$), based on 100 mol % of total monomers (m+n+p) in which n refers to a nonconductive moiety including no conducting polymer, and p refers to a moiety having an aryl group. When the content of the conductive moiety is less than 0.1 mol %, conductivity cannot be sufficiently achieved. When the content of the conductive moiety is greater than 99 mol %, doping cannot be sufficiently achieved due to a low content of the ionic group.

When $0<p<10,000,000$, the conducting polymer according to the current embodiment of the present invention has a copolymer form with an ionic monomer unit including a conjugated ionic group having an aryl group, thereby improving mobility of a carrier in the conducting polymer. The content of the ionic conjugated copolymer having an aryl group may be 0.1 to 99 mol % (i.e., $0.001<p/(m+n+o+p)<0.99$), preferably 1 to 50 mol % (i.e., $0.01<p/(m+n+o+p)<0.5$), based on 100 mol % of total monomers. When the content of the copolymer is less than 0.1 mol %, mobility can be reduced. When the content of the copolymer is greater than 99 mol %, segmental motion is so difficult that self-doping can be reduced.

When p=0, the conducting polymer according to the current embodiment of the present invention has a copolymer form that does not include a conjugated-type main chain including an aryl group, thereby reducing mobility of a carrier compared to a copolymer form including a conjugated-type main chain having an aryl group. The m, which refers to the content of conductive moiety including a grafted conducting polymer may be 0.1 to 99 mol % (i.e., $0.001<m/(m+n+o)<0.99$), preferably 1-50 mol % (i.e., $0.01<m/(m+n+o)<0.5$), based on 100 mol % of total monomers (m+n+o) in which n referring to a nonconductive moiety having no conducting polymer, and o refers to a nonionic monomer moiety. When the content of the conductive moiety is less than 0.1 mol %, conductivity cannot be sufficiently achieved. When the content of the conductive moiety is greater than 99 mol %, doping cannot be sufficiently achieved due to a low content of the ionic group.

As described above, in Formula 1, at least one hydrogen atom of $R_1$, $R_2$, $R_3$, $R_1'$, $R_2'$, $R_3'$, and $R_4'$ may be substituted with an ionic group, or an ionic group itself can be directly substituted with B or B'. Examples of an anion substituent include $PO_3^{2-}$, $SO_3^-$, $COO^-$, $I^-$, $CH_3COO^-$. Counter ions of the anion can be a metal ion such as $Na^+$, $K^+$, $Li^+$, $Mg^{+2}$, $Zn^{+2}$, and $Al^{+3}+$, or an organic ion such as $H^+$, $NH_4^+$, $CH_3(-CH_2-)_nO^+$ where n is an integer in the range of 0 to 50.

When two or more ionic groups are included, monomer units may preferably have ionic groups having different acidities. For example, when one of $R_1$, $R_2$, and $R_3$ is $PO_3^{2-}$, one of $R_1'$, $R_2'$, $R_3'$, and $R_4'$ can be substituted with one of $SO_3^-$, $COO^-$, $I^-$, and $CH_3COO^-$. When one of $R_1$, $R_2$, and $R_3$ is $SO_3^-$, one of $R_1'$, $R_2'$, $R_3'$, and $R_4'$ can be substituted with one of $COO^-$, $I^-$, and $CH_3COO^-$.

The conducting polymer having the repeating unit represented by Formula 1 can be a compound represented by Formula 1 where each of A, B, A', B', A", and B" is a carbon atom; each of $R_1$, $R_2$, $R_3$, $R_1'$, $R_2'$, and $R_3'$ is a hydrogen atom; $R_4$ is aminophenylene

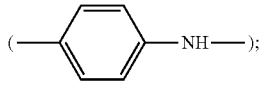

$R_4'$ is a sulfate phenyl group; $R_5$ is polyaniline having a degree of polymerization of 2 to 10,000,1000; each of $R_1"$, $R_2"$ and $R_3"$ is hydrogen atom; $R_4"$ is a substituted or unsubstituted phenyl group; X, X' and X are single bonds; Ar is represented by Formula 1B or 1T; a, b, and c are 0; $0<m<10,000,000$; $0<n<10,000,000$; $0<o<10,000,000$; and $0\leq p<10,000,000$, and the conducting polymer having the repeating unit of Formula 1 can have the following structures:

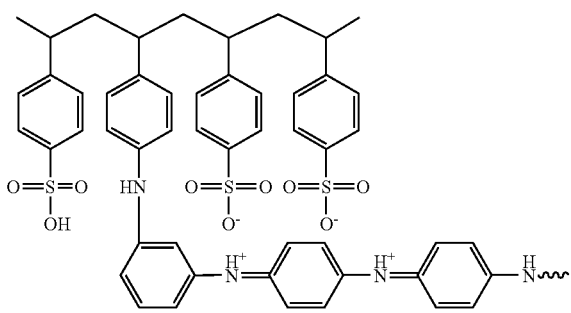

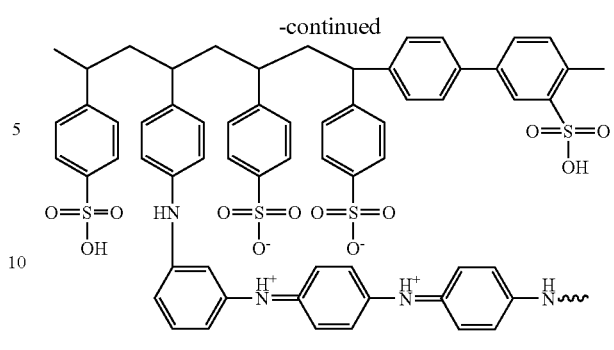

Also, the conducting polymer having the repeating unit represented by Formula 1 can be a compound represented by Formula 1 where each of A, B, A', B', A", and B" is a carbon atom and each of $R_1$, $R_2$, $R_3$, $R_1'$, $R_2'$, $R_3'$, and $R_4'$ is a hydrogen atom;

$R_4$ is a methylenephenylene group

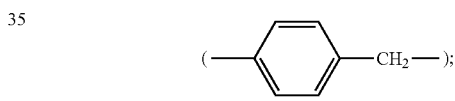

$R_5$ is polypyrrole having a degree of polymerization of 2 to 10,000,000; X, X', and X" are single bonds; each of $R_1"$, $R_2"$ and $R_3"$ is a hydrogen atom; $R_4"$ is a substituted or unsubstituted phenyl group; a, b, and c are 0; $0<m<10,000,000$; $0<n<10,000,000$; $0<o<10,000,000$; and $0\leq p<10,000,000$, and the conducting polymer having the repeating unit of Formula 1 can have the following structure:

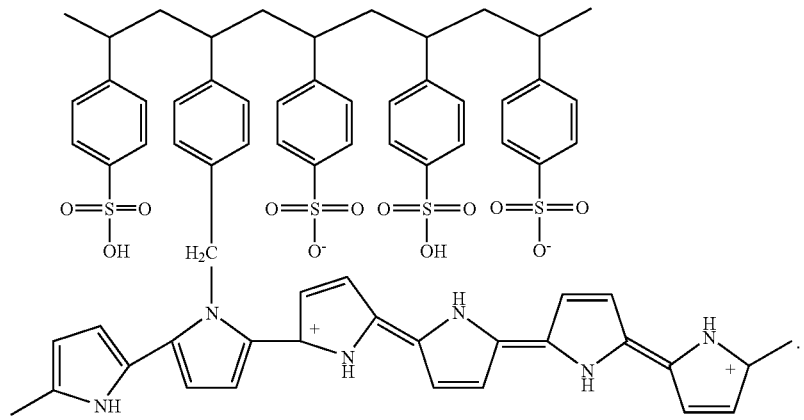

Also, the conducting polymer having the repeating unit represented by Formula 1 can be a compound represented by Formula 1 where each of A, B, A', B', A", and B" is a carbon atom; each of $R_1$, $R_2$, $R_3$, $R_1'$, $R_2'$, $R_3'$, and $R_4'$ is a hydrogen atom; $R_4$ is a methylenephenylene group

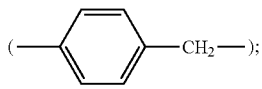

$R_5$ is polyethylenedioxythiophene having a degree of polymerization of 2 to 10,000,000; X, X', and X" are single bonds; a, b, and c are 0; each of $R_1"$, $R_2"$ and $R_3"$ is a hydrogen atom; $R_4"$ is a substituted or unsubstituted phenyl group; a, b, and c are 0; 0<m<10,000,000; 0<n<10,000,000; 0<o<10,000,000; and 0≦p<10,000,000, and the conducting polymer having the repeating unit of Formula 1 can have the following structure:

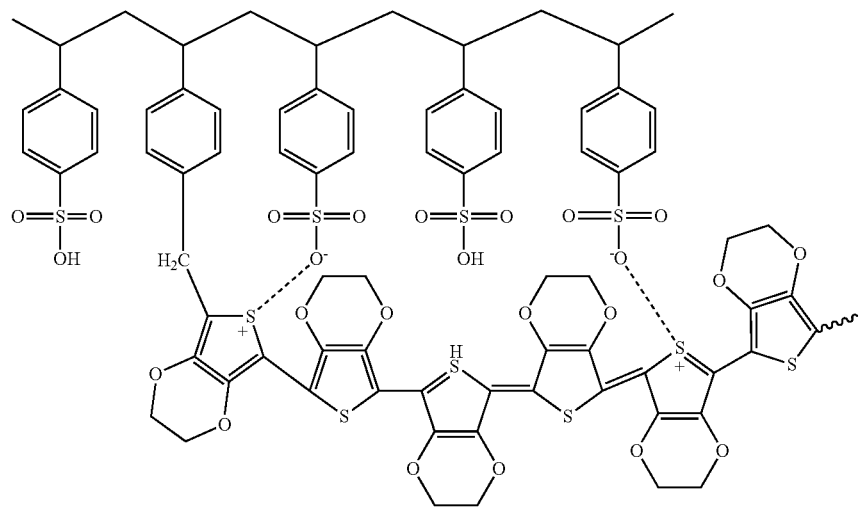

Another example of the conducting polymer having the repeating unit represented by Formula 1 includes compounds represented by Formulas 2A through 2C.

[Formula 2A]

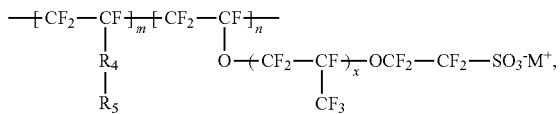

[Formula 2B]

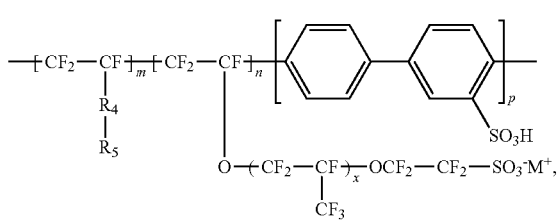

[Formula 2C]

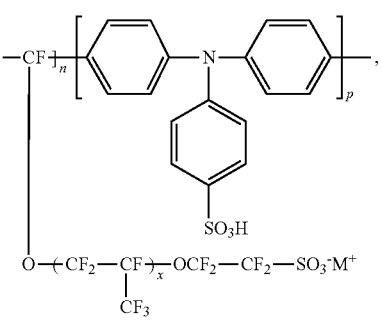

where 0<m<10,000,000, 0<n<10,000,000, 0<p<10,000,000, 0<x<10,000,000, and M is a hydrogen atom or sodium;

$R_4$ is selected from the group consisting of a single bond, O, S, a substituted or unsubstituted C1-C30 alkylene group, a substituted or unsubstituted C1-C30 iminoalkylene group, a substituted or unsubstituted C1-C30 heteroalkylene group, a substituted or unsubstituted C6-C30 arylene group, a substituted or unsubstituted C6-C30 iminoarylene group, a substituted or unsubstituted C6-C30 arylalkylene group, a substituted or unsubstituted C6-C30 alkylarylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group, and a substituted or unsubstituted C6-C30 heteroarylester group; and $R_5$ is polyaniline, polypyrrole, or polyethylenedioxythiophene having a degree of polymerization of 2 to 10,000,000.

Also, a conducting polymer composition according to the an embodiment of the present invention can further include a first ionomer having a repeating unit represented by Formula 3 below and a degree of polymerization of 10 to 10,000,000 comprising:

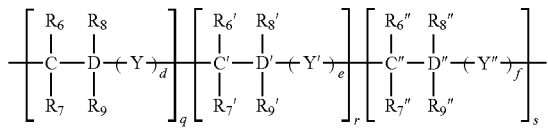
[Formula 3]

where $0 \leq q < 10{,}000{,}000$, $0 \leq r < 10{,}000{,}000$, $0 \leq s < 10{,}000{,}000$, $0 \leq d \leq 20$, $0 \leq e \leq 20$, $0 \leq f \leq 20$, each of C, D, C', D', C" and D" is independently selected from the group consisting of C, Si, Ge, Sn, and Pb;

each of $R_6$, $R_7$, $R_8$, $R_9$, $R_6'$, $R_7'$, $R_8'$, $R_9'$, $R_6''$, $R_7''$, $R_8''$, and $R_9''$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C6-C30 heteroarylester group;

at least one of $R_6$, $R_7$, $R_8$, $R_9$, $R_6'$, $R_7'$, $R_8'$, and $R_9'$ is an ionic group, or includes an ionic group; and each of Y, Y', and Y" is independently selected from the group consisting of a single bond, O, S, a substituted or unsubstituted C1-C30 alkylene group, a substituted or unsubstituted C1-C30 heteroalkylene group, a substituted or unsubstituted C6-C30 arylene group, a substituted or unsubstituted C6-C30 arylalkylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group, and a substituted or unsubstituted C6-C30 heteroarylester group.

An ionomer refers to a polymer including an ionic group, and can be represented by the above formula.

A first ionomer according to an embodiment of the present invention includes a different ionic group for every repeating unit in Formula 3, and thus an ionic group having low acidity in one unit grants low hygroscopicity, and an ionic group having high acidity in another unit improves the doping effect of the conducting polymer.

When $0 < s < 10{,}000{,}000$, the first ionomer according to the current embodiment of the present invention has a copolymer form with a nonionic monomer unit having no ionic group, thereby reducing the content of ionic groups in the first ionomer to an appropriate range and finally reducing the content of a residue decomposed by reaction with electrons. The content of a nonionic copolymer may be 0.1 to 99 mol % (i.e., $0.001 < s/(q+r+s) < 0.99$), preferably 1 to 50 mol % (i.e, $0.001 < s/(q+r+s) < 0.5$), based on 100 mol % of total monomers. When the content of the copolymer is less than 0.1 mol %, the function of a nonionic group can not be sufficiently carried out. When the content of the polymer is greater than 99 mol %, doping cannot be sufficiently achieved due to a low content of the ionic group.

Preferably, the conducting polymer composition according to the embodiment of the present invention may contain 0.01 to 5,000 parts by weight of the first ionomer having the repeating unit represented by Formula 3, more preferably 50 to 2,000 parts by weight, based on 100 parts by weight of the conducting polymer. When the content of the polymer having the repeating unit represented by Formula 3 is less than 0.01 parts by weight, addition of the first ionomer does not affect a change in characteristic of the conducting polymer. When the content of the first ionomer is greater than 5,000 parts by weight, conductivity is significantly reduced.

At least one hydrogen atom of $R_6$, $R_7$, $R_8$, $R_9$, $R_6'$, $R_7'$, $R_8'$, and $R_9'$ in Formula 3 can be substituted with an ionic group, or an ionic group itself can be directly substituted with D or D'. The ionic group is the same as described above.

The first ionomer having the repeating unit of Formula 3 can be compounds represented by Formulas 4 through 18:

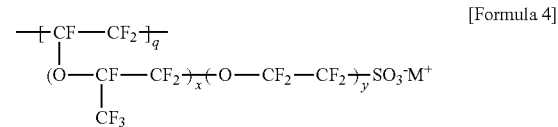
[Formula 4]

where q is an integer in the range of 1 to 10,000,000, each of x and y is independently an integer in the range of 0 to 10, and $M^+$ is $Na^+$, $K^+$, $Li^+$, $H^+$, $CH_3(CH_2)_n NH_3^+$ where n is an integer in the range of 0 to 50, $NH_4^+$, $NH_2^+$, $NHSO_2CF_3^+$, $CHO^+$, $C_2H_5OH^+$, $CH_3OH^+$, and $RCHO^+$ where R is an alkyl group, i.e., $CH_3(CH_2)_n^-$; n is an integer in the range of 0 to 50;

[Formula 5]

where q is an integer in the range of 1 to 10,000,000;

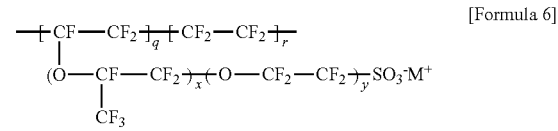
[Formula 6]

where $0 < q \leq 10{,}000{,}000$, $0 \leq r < 10{,}000{,}000$, each of x and y is independently an integer in the range of 0 to 20, and $M^+$ is $Na^+$, $K^+$, $Li^+$, $H^+$, $CH_3(CH_2)_n NH_3^+$ where n is an integer in the range of 0 to 50, $NH_4^+$, $NH_2^+$, $NHSO_2CF_3^+$, $CHO^+$, $C_2H_5OH^+$, $CH_3OH^+$, and $RCHO^+$ where R is an alkyl group, i.e., $CH_3(CH_2)_n^-$; n is an integer in the range of 0 to 50;

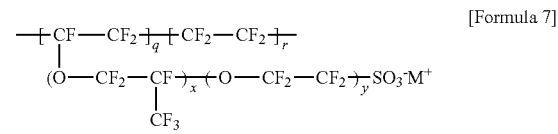
[Formula 7]

where $0 < q \leq 10{,}000{,}000$, $0 \leq r < 10{,}000{,}000$, each of x and y is independently an integer in the range of 0 to 20, and $M^+$ is Na$^+$, K$^+$, Li$^+$, H$^+$, CH$_3$(CH$_2$)$_n$NH$_3$$^+$ where n is an integer in the range of 0 to 50, NH$_4$$^+$, NH$_2$$^+$, NHSO$_2$CF$_3$$^+$, CHO$^+$, C$_2$H$_5$OH$^+$, CH$_3$OH$^+$, and RCHO$^+$ where R is an alkyl group, i.e., CH$_3$(CH$_2$)$_n$; where n is an integer in the range of 0 to 50;

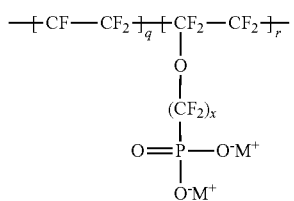
[Formula 8]

where $0 < q \leq 10,000,000$, $0 \leq r < 10,000,000$, x is an integer in the range of 0 to 20, and M$^+$ is Na$^+$, K$^+$, Li$^+$, H$^+$, CH$_3$(CH$_2$)$_n$NH$_3$$^+$ where n is an integer in the range of 0 to 50, NH$_4$$^+$, NH$_2$$^+$, NHSO$_2$CF$_3$$^+$, CHO$^+$, C$_2$H$_5$OH$^+$, CH$_3$OH$^+$, and RCHO$^+$ where R is an alkyl group, i.e., CH$_3$(CH$_2$)$_n$$^-$; n is an integer in the range of 0 to 50;

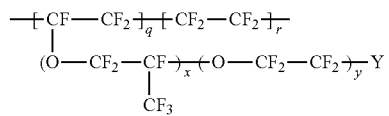
[Formula 9]

where $0 < q \leq 10,000,000$, $0 \leq r < 10,000,000$, each of x and y is independently a number in the range of 0 to 20, Y is a compound selected from the group consisting of —SO$_3$$^-$M$^+$, —COO$^-$M$^+$, —SO$_3$$^-$NHSO$_2$CF$_3$$^+$, and —PO$_3$$^{2-}$(M$^+$)$_2$, and M$^+$ is Na$^+$, K$^+$, Li$^+$, H$^+$, CH$_3$(CH$_2$)$_n$NH$_3$$^+$ where n is an integer in the range of 0 to 50, NH$_4$$^+$, NH$_2$$^+$, NHSO$_2$CF$_3$$^+$, CHO$^+$, C$_2$H$_5$OH$^+$, CH$_3$OH$^+$, and RCHO$^+$ where R is an alkyl group, i.e., CH$_3$(CH$_2$)$_n$$^-$; n is an integer in the range of 0 to 50;

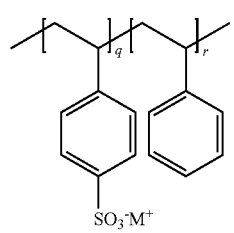
[Formula 10]

where $0 < q \leq 10,000,000$, $0 \leq r < 10,000,000$, and M$^+$ is Na$^+$, K$^+$, Li$^+$, H$^+$, CH$_3$(CH$_2$)$_n$NH$_3$$^+$ where n is an integer in the range of 0 to 50, NH$_4$$^+$, NH$_2$$^+$, NHSO$_2$CF$_3$$^+$, CHO$^+$, C$_2$H$_5$OH$^+$, CH$_3$OH$^+$, and RCHO$^+$ where R is an alkyl group, i.e., CH$_3$(CH$_2$)$_n$$^-$; n is an integer in the range of 0 to 50;

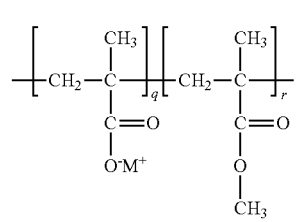
[Formula 11]

where $0 < q \leq 10,000,000$, $0 \leq r < 10,000,000$, and M$^+$ is Na$^+$, K$^+$, Li$^+$, H$^+$, CH$_3$(CH$_2$)$_n$NH$_3$$^+$ where n is an integer in the range of 0 to 50, NH$_4$$^+$, NH$_2$$^+$, NHSO$_2$CF$_3$$^+$, CHO$^+$, C$_2$H$_5$OH$^+$, CH$_3$OH$^+$, RCHO$^+$ where R is an alkyl group, i.e., CH$_3$(CH$_2$)$_n$$^-$; n is an integer in the range of 0 to 50;

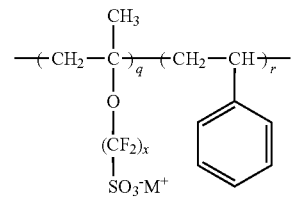
[Formula 12]

where $0 < q \leq 10,000,000$, $0 \leq r < 10,000,000$, x is an integer in the range of 0 to 20, and M$^+$ is Na$^+$, K$^+$, Li$^+$, H$^+$, CH$_3$(CH$_2$)$_n$NH$_3$$^+$ where n is an integer in the range of 0 to 50, NH$_4$$^+$, NH$_2$$^+$, NHSO$_2$CF$_3$$^+$, CHO$^+$, C$_2$H$_5$OH$^+$, CH$_3$OH$^+$, RCHO$^+$ where R is an alkyl group, i.e., CH$_3$(CH$_2$)$_n$$^-$; n is an integer in the range of 0 to 50;

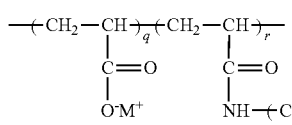
[Formula 13]

where $0 < q \leq 10,000,000$, $0 \leq r < 10,000,000$, each of x and y is independently an integer in the range of 0 to 20, and M$^+$ is Na$^+$, K$^+$, Li$^+$, H$^+$, CH$_3$(CH$_2$)$_n$NH$_3$$^+$ where n is an integer in the range of 0 to 50, NH$_4$$^+$, NH$_2$$^+$, NHSO$_2$CF$_3$$^+$, CHO$^+$, C$_2$H$_5$OH$^+$, CH$_3$OH$^+$, RCHO$^+$ where R is an alkyl group, i.e., CH$_3$(CH$_2$)$_n$$^-$; n is an integer in the range of 0 to 50;

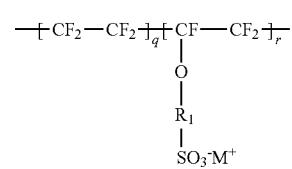
[Formula 14]

where $0 \leq q < 10,000,000$, $0 < r \leq 10,000,000$, R$_f$= —(CF$_2$)$_z$— where z is 1 or an integer in the range of 3 to 50, —(CF$_2$CF$_2$O)$_z$CF$_2$CF$_2$— where z is an integer in the range of 1 to 50, —(CF$_2$CF$_2$CF$_2$O)$_z$CF$_2$CF$_2$— where z is an integer in the range of 1 to 50, and M$^+$ is Na$^+$, K$^+$, Li$^+$, H$^+$, CH$_3$(CH$_2$)$_n$NH$_3$$^+$ where n is an integer in the range of 0 to 50, NH$_4$$^+$, NH$_2$$^+$, NHSO$_2$CF$_3$$^+$, CHO$^+$, C$_2$H$_5$OH$^+$, CH$_3$OH$^+$, RCHO$^+$ where R is an alkyl group, i.e., CH$_3$(CH$_2$)$_n$$^-$; n is an integer in the range of 0 to 50;

[Formula 15]

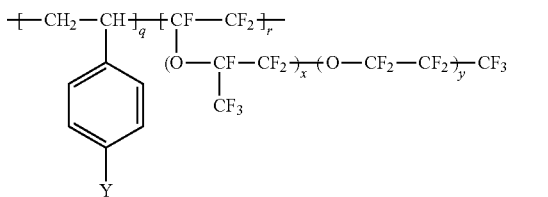

where $0 \leq q < 10,000,000$, $0 < r \leq 10,000,000$, each of x and y is independently an integer in the range of 0 to 20, Y is one compound selected from $-SO_3^-$, $-COO^-M^+$, $-SO_3^-NHSO_2CF_3^+$, and $-PO_3^{2-}(M^+)_2$, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, and $RCHO^+$ where R is an alkyl group, i.e., $CH_3(CH_2)_n^-$; n is an integer in the range of 0 to 50;

[Formula 16]

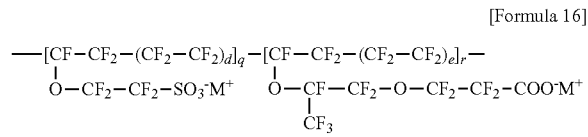

where $0 \leq q < 10,000,000$, $0 < r \leq 10,000,000$, $0 \leq d \leq 20$, $0 \leq e \leq 20$, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, and $RCHO^+$ where R is an alkyl group, i.e., $CH_3(CH_2)_n^-$; n is an integer in the range of 0 to 50;

[Formula 17]

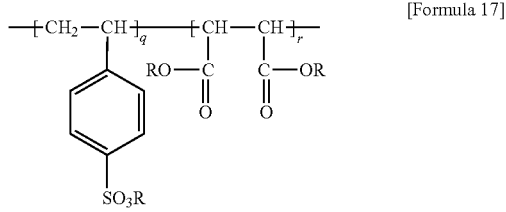

where $0 \leq q < 10,000,000$, $0 < r \leq 10,000,000$, and R is H; and

[Formula 18]

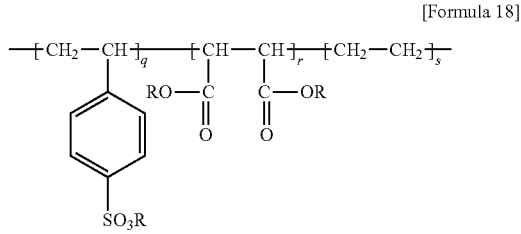

where $0 \leq q < 10,000,000$, $0 < r \leq 10,000,000$, $0 < s \leq 10,000,000$, and R is H.

For example, the first ionomer has the repeating unit of Formula 3 where q=1, r=1, and s=0, and is a hydrocarbon-based, fluorocarbon-based, or silicon-based polymer. The first ionomer having the repeating unit of Formula 3 may be a perfluorinated ionomer.

The conducting polymer composition according to an embodiment of the present invention can include a conducting polymer and additionally at least one second ionomer having a degree of polymerization of 10 to 10,000,000 having the repeating unit of Formula 3 that has a different structure compared to the first ionomer structure.

Examples of the second ionomer include at least one ionomer in which $1 \leq q \leq 10,000,000$, r=0, s=0 in the first ionomer of Formula 3.

Another example of the second ionomer include at least one compound selected from hydrocarbon-based, fluorocarbon-based, and silicon-based polymers in which $1 \leq q \leq 10,000,000$, $1 \leq r \leq 10,000,000$, s=0 in the repeating unit of Formula 3.

The content of the second ionomer may be 0.01 to 5,000 parts by weight, preferably 50 to 2,000 parts by weight, based on 100 parts by weight of the conducting polymer. When the content of the second ionomer is less than 0.01 parts by weight, addition of the conducting polymer does not affect a change in characteristic of the polymer. When content of the second ionomer is greater than 5,000 parts by weight, conductivity is significantly reduced.

Examples of the unsubstituted alkyl group that is a substituent used in the embodiments of the present invention include straight or branched chain type such as methyl, ethyl, propyl, isobutyl, sec-butyl, tert-butyl, pentyl, iso-amyl, hexyl, etc. At least one hydrogen atom in the alkyl group may be substituted with a halogen atom, a hydroxy group, a nitro group, a cyano group, a substituted or unsubstituted amino group ($-NH_2$, $-NH(R)$, or $-N(R')(R'')$, in which each of R' and R'' is independently a C1-C10 alkyl group, an amidino group, a hydrazine group, or a hydrazone group, a carboxylic group, a sulfonic acid group, a phosphoric acid group, a C1-C20 alkyl group, a C1-C20 halogenated alkyl group, a C1-C20 alkenyl group, a C1-C20 alkynyl group, a C1-C20 heteroalkyl group, a C6-C20 aryl group, a C6-C20 arylalkyl group, a C6-C20 heteroaryl group, or a C6-C20 heteroarylalkyl group.

The heteroalkyl group refers to the alkyl group in which at least one carbon atom, preferably 1-5 carbon atoms on the backbone, are substituted with one or more heteroatoms such as an oxygen atom, a sulfur atom, a nitrogen atom, a phosphorous atom, etc.

The aryl group refers to a carbocyclic aromatic system containing at least one aromatic ring. The rings may be attached or fused together using a pendent method. Examples of the aryl group include aromatic groups such as phenyl, naphthyl, tetrahydronaphthyl, etc. At least one hydrogen atom of the aryl group can be substituted with the substituents of the alkyl group.

The heteroaryl group refers to a cyclic aromatic system which is a 5-30 membered ring having 1, 2, or 3 hetero atoms selected from N, O, P, or S, and C as the remaining ring members. The rings can be attached or fused together using a pendent method. At least one hydrogen atom of the heteroaryl group can be substituted with the substituents of the alkyl group.

The alkoxy group denotes a radical of $-O$-alkyl, in which the alkyl is the same as defined above. Examples of the alkoxy group include methoxy, ethoxy, propoxy, isobutyloxy, sec-butyloxy, pentyloxy, iso-amyloxy, hexyloxy, etc. At least one hydrogen atom of the alkoxy group can be substituted with the substituents of the alkyl group.

The heteroalkoxy group is basically the alkoxy group except that at least one hetero atom, for example, oxygen, sulfur, or nitrogen is present in an alkyl chain, and examples thereof include $CH_3CH_2OCH_2CH_2O-$, $C_4H_9OCH_2CH_2OCH_2CH_2O-$, and $CH_3O(CH_2CH_2O)_nH$.

The arylalkyl group is the aryl group in which some hydrogen atoms are substituted with lower alkyl radicals, for example, methyl, ethyl, and propyl. Examples of the arylalkyl group include benzyl and phenylethyl. At least one hydrogen atom of the arylalkyl group can be substituted with the substituents of the alkyl group.

The heteroarylalkyl group refers to the heteroaryl group in which some hydrogen atoms are substituted with lower alkyl groups and heteroaryl of a heteroarylalkyl group is the same as defined above. At least one hydrogen atom of the heteroarylalkyl group can be substituted with the substituents of the alkyl group.

The aryloxy group denotes a radical of —O-aryl, in which the aryl is the same as defined above. Examples of the aryloxy group include phenoxy, naphthoxy, anthracenyloxy, phenanthrenyloxy, fluorenyloxy, and indenyloxy. At least one hydrogen atom of the aryloxy group can be substituted with the same substituents as those in the alkyl group.

The heteroaryloxy group denotes a radical of —O-heteroaryl, in which the heteroaryl is the same as defined above.

Examples of the heteroaryloxy group include benzyloxy and phenylethyloxy. At least one hydrogen atom of the heteroaryloxy group can be substituted with the substituents of the alkyl group.

The cycloalkyl group refers to a monovalent monocyclic system having 5-30 carbon atoms. At least one hydrogen atom of the cycloalkyl group can be substituted with the substituents of the alkyl group.

The heterocycloalkyl group refers to a monovalent monocyclic system which is a 5-30 membered ring having 1, 2, or 3 hetero atoms selected from N, O, P and S, and C as the remaining ring members. At least one hydrogen atom of the cycloalkyl group can be substituted with the substituents of the alkyl group.

The alkyl ester group refers to a functional group where an alkyl group and an ester group are combined together, in which the alkyl group is the same as defined above.

The heteroalkylester group refers to the heteroalkyl group combined with an ester group, and the heteroalkyl group is the same as defined above.

The arylester group refers to the aryl group combined with an ester group, and the aryl group is the same as defined above.

The heteroarylester group refers to the heteroaryl group combined with an ester group, in which the heteroaryl group is the same as defined above.

The amino group represents —$NH_2$, —NH(R) or —N(R')(R"), in which each of R' and R" is independently an alkyl group having 1-10 carbon atoms.

The halogen may be fluorine, chlorine, bromine, iodine, or astatine, and preferably fluorine.

Also, in order to improve the cross-linking ability of the conducting polymer and the ionomer, the conducting polymer composition can further include a physical cross-linking agent and/or a chemical cross-linking agent.

The physical cross-linking agent functions as a bridge between polymer chains, and can be a small molecule or polymer compound containing —OH. Examples of the physical cross-linking agent include a small molecule compound such as glycerol, butanol, a polymer compound such as polyvinyl alcohol, polyvinylphenol, polyethyleneglycol. In addition, polyethyleneimine and polyvinylpyrrolidone can be also used as the physical cross-linking agent.

The content of the physical cross-linking agent may be 0.001 to 5 parts by weight, preferably 0.1 to 3 parts by weight, based on 100 parts by weight of the conducting polymer composition. When the content of the physical cross-linking agent is less than 0.001 parts by weight, cross-linking ability can not be sufficiently achieved due to the small amount. When the content of the physical cross-linking agent is greater than 5 parts by weight, morphology of the conducting polymer thin film is not good.

The function of the chemical cross-linking agent is to chemically cross-link polymer chains and the chemical cross-linking agent refers to chemical materials that can be polymerized in-situ and can form an interpenetrating polymer network (IPN). Silane-based materials, in particularly tetraethyloxysilane (TEOS) can be used as the chemical cross-linking agent. In addition, polyaziridine, melamine-based, and epoxy-based materials can be used.

The content of the chemical cross-linking agent may be 0.001 to 50 parts by weight, preferably 1 to 10 parts by weight, based on 100 parts by weight of the conducting polymer composition. When the content of the chemical cross-linking agent is less than 0.001 parts by weight, cross-linking ability can not be sufficiently achieved. When the content of the chemical cross-linking agent is greater than 50 parts by weight, conductivity of the conducting polymer is significantly reduced.

The conducting polymer composition according to an embodiment of the present invention can further include nano-sized metal particles. The nano-sized metal particles can further improve conductivity of a layer obtained from the conducting polymer composition.

The nano-sized metal particles can be at least one nano-sized particles selected from the group consisting of Au, Ag, Cu, Pd, and Pt. Preferably, the nano-sized metal particles can have an average diameter of 5 to 20 nm. When the average diameter of the nano-sized metal particles is less than 5 nm, the nano-sized particles themselves can be easily conglomerated. When the average diameter of the nano-sized metal particles is greater than 20 nm, surface smoothness of layers can not be properly controlled.

Also, the conducting polymer composition according to an embodiment of the present invention can further include nano-sized particles of an inorganic compound. When the nano-sized particles of the inorganic compound form layers using the conducting polymer composition including the same, the nano-sized particles are dispersed in the layers thereby helping conduction in a network between conducting polymer chains or enhancing the network.

The nano-sized particles of the inorganic compound can be at least one particles selected from the group consisting of $SiO_2$ and $TiO_2$. The nano-sized particles of the inorganic compound can have an average diameter of 5 to 100 nm. When the average diameter of the nano-sized particles of the inorganic compound is less than 5 nm, nano-sized particles themselves can be easily conglomerated. When the average diameter of the nano-sized particles of the inorganic compound is greater than 100 nm, surface smoothness of layers can not be properly controlled.

When forming layers using the conducting polymer composition, for example, the composition is dissolved or dispersed in a predetermined solvent. Thereafter, the product is coated on a predetermined substrate and can be dried and/or heated.

The solvent provides a predetermined viscosity to the conducting polymer composition described as above. Any materials that can dissolve or disperse the conducting polymer composition can be used as the solvent. Examples of the solvent include, but are not limited to, water, alcohol, toluene, xylene, chlorobenzene, chloroform, di-chloroethane, dimethylformamide, and dimethylsulfoxide. Various coating methods used to coat the conducting polymer composition on a predetermined substrate include, for example, a spin coating method, a deep coating method, an ink-jet printing method, and a nozzle printing method. After the coating process, the coated layer is dried and/or heated and finally the layer formation is terminated.

The layer obtained from the conducting polymer composition can be appropriately used as a conductive layer of all kinds of electronic devices. Examples of the electronic devices include, but are not limited to, an organic light emitting device, a photovoltaic device, an electrochromic device, an organic thin film transistor, and an organic memory device.

Particularly, in an organic light emitting device, the conducting polymer composition is used in an electric charge injection layer, i.e., a hole injection layer or an electron injection layer. Therefore, holes and electrons are uniformly efficiently injected into a light emitting polymer resulting in improved light emitting power and efficiency of the organic light emitting device.

In a photovoltaic device, the conducting polymer is used as an electrode or an electrode buffer layer, thereby improving quantum efficiency. In an organic thin film transistor, the conducting polymer is used as an electrode material in a gate electrode, a source-drain electrode, etc.

Hereinafter, an organic light emitting device employing the conducting polymer composition according to an embodiment of the present invention and a method of manufacturing the same will be described as follows.

FIGS. 1A through 1D are diagrams schematically illustrating structures of an organic light emitting device according to exemplary embodiments of the present invention.

In the organic light emitting device illustrated in FIG. 1A, an emissive layer 12 is deposited on a first electrode 10, a hole injection layer (HIL) (also referred to as a "buffer layer") 11 is formed between the first electrode 10 and the emissive layer 12, a hole blocking layer (HBL) 13 is deposited on the emissive layer 12, and a second electrode 14 is formed on the hole blocking layer (HBL) 13.

Figure 1B:
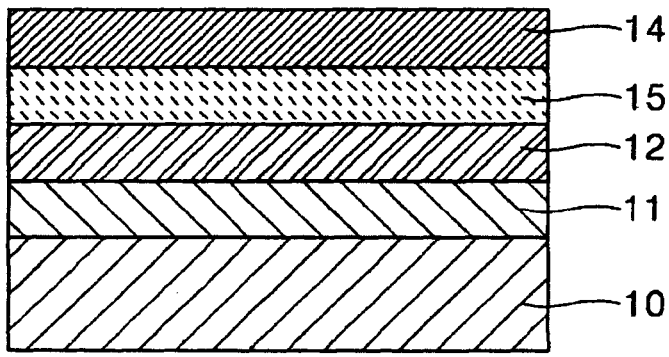

The organic light emitting device illustrated in FIG. 1B has the same structure as that of FIG. 1A, except that an electron transport layer (ETL) 15 instead of the hole blocking layer (HBL) 13 is formed on the emissive layer 12.

Figure 1C:
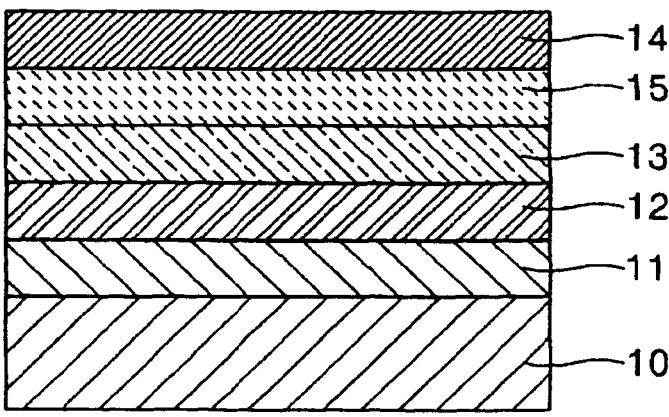

The organic light emitting device illustrated in FIG. 1C has the same structure as that of FIG. 1A, except that the hole blocking layer (HBL) 13 and the electron transport layer (ETL) 15, which are sequentially formed, are used instead of the hole blocking layer (HBL) 13 formed on the emissive layer 12.

Figure 1D:
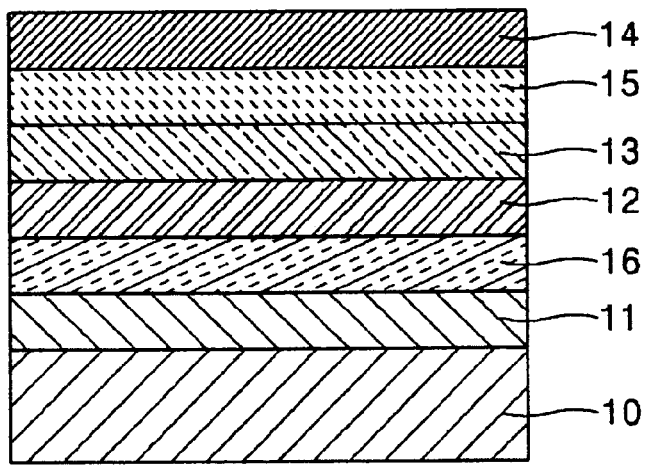

The organic light emitting device illustrated in FIG. 1D has the same structure as that of FIG. 1C, except that a hole transport layer (HTL) 16 is further formed between the hole injection layer (HIL) 11 and the emissive layer 12. The hole transport layer (HTL) 16 prevents penetration of impurities from the hole injection layer (HIL) 11 to the emissive layer 12.

The organic light emitting devices having the structures as illustrated in FIGS. 1A through 1D can be manufactured using conventional methods, which are not particularly limited.

Hereinafter, a method of manufacturing an organic light emitting device according to an embodiment of the present invention will now be described.

First, a patterned first electrode 10 is formed on a substrate (not shown). The substrate is a substrate used in a conventional organic light emitting device and may be a glass substrate or a transparent plastic substrate having good transparency, surface smoothness, manageability and waterproofness. The thickness of the substrate may be 0.3 to 1.1 mm.

A material for the first electrode 10 is not particularly limited. If the first electrode 10 is an anode, the anode is composed of a conductive metal or an oxide thereof, which makes it easy to inject holes. Examples of such a material include Indium tin oxide (ITO), indium zinc oxide (IZO), Ni, Pt, Au, Ir, etc.

The substrate having the first electrode 10 formed thereon is washed, and then is subjected to UV and ozone treatment. An organic solvent such as isopropanol (IPA) or acetone is used to wash the substrate.

A hole injection layer (HIL) 11 including the conducting polymer composition according to an embodiment of the present invention is formed on the first electrode 10. The formation of the hole injection layer (HIL) 11 reduces contact resistance of the first electrode 10 and an emissive layer 12 and improves hole transport between the first electrode 10 and the emissive layer 12, thereby improving driving voltage and lifetime of the organic light emitting device.

The hole injection layer (HIL) 11 is formed by spin coating a HIL forming composition, which is prepared by dissolving the conducting polymer composition in a solvent, on the first electrode 10 and drying it. The HIL forming composition and the conducting polymer composition are mixed in a weight ratio of 1:1 to 1:30 and diluted to 0.5 to 10% by weight by using water, alcohol, and/or organic solvents such as dimethylformamide, dimethylsulfoxide, dichloroethane, etc.

The solvent may be any solvent that can dissolve the conducting polymer composition and examples thereof include water, alcohol, dimethylformamide (DMF), toluene, xylene, and chlorobenzene.

The thickness of the hole injection layer (HIL) 11 may be 5 to 1,000 nm, preferably 10 to 100 nm, more preferably 50 nm. When the thickness of the hole injection layer (HIL) 11 is less than 5 nm, injection of holes is not fully performed due to the very thin thickness. When the thickness of the hole injection layer (HIL) 11 is greater than 1,000 nm, light transmittance may be reduced.

The emissive layer 12 is formed on the hole injection layer (HIL) 11. A material for the emissive layer 12 is not particularly limited, but examples thereof include oxadiazole dimer dyes (Bis-DAPOXP), spiro compounds (Spiro-DPVBi, Spiro-6P), triarylamine compounds, bis(styryl)amine (DPVBi, DSA), Compound (A), bis[2-(4,6-difluorophenyl) pyridinato-N,$C^{2'}$]iridium picolinate (FIrpic), CzTT, Anthracene, 1,1,4,4-tetraphenyl-1,3-butadiene (TPB), 1,2,3,4,5-pentaphenyl-1,3-cyclopentadiene (PPCP), DST, TPA, OXD-4, BBOT, AZM-Zn, etc. which are blue materials, Coumarin 6, C545T, quinacridone, tris(2-phenylpyridine)-iridium (Ir(ppy)$_3$), etc., which are green materials, and DCM1, DCM2, Eu(thenoyltrifluoroacetone)$_3$ (Eu(TTA)$_3$), butyl-6-(1,1,7,7-tetramethyljulolidyl-9-enyl)-4H-pyran (DCJTB), etc., which are red materials. In addition, examples of the polymer light-emitting material include polymers such as phenylene, phenylene vinylene, thiophene, fluorene, and spiro-fluorene-based polymers and aromatic compounds containing nitrogen, but are not limited thereto.

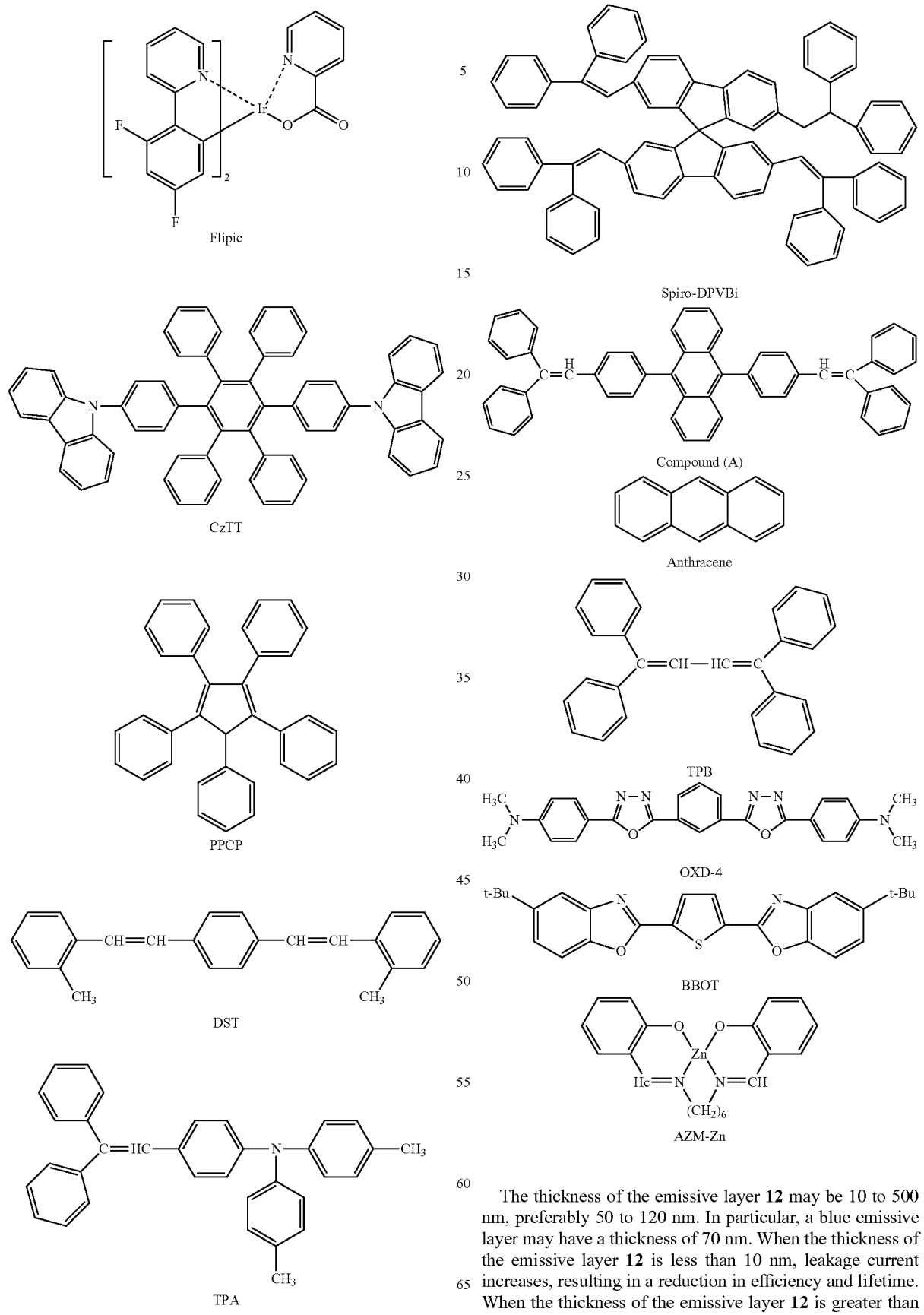

The thickness of the emissive layer 12 may be 10 to 500 nm, preferably 50 to 120 nm. In particular, a blue emissive layer may have a thickness of 70 nm. When the thickness of the emissive layer 12 is less than 10 nm, leakage current increases, resulting in a reduction in efficiency and lifetime. When the thickness of the emissive layer 12 is greater than 500 nm, driving voltage is significantly increased.

The emissive layer forming composition further includes a dopant, if necessary. The amount of the dopant varies depending on a material for the emissive layer 12, but may be generally 30 to 80 parts by weight based on 100 parts by weight of a material for the emissive layer 12 (total weight of the host and the dopant). When the amount of the dopant is not within this range, the luminous characteristics of the organic light emitting display device are reduced. Examples of the dopant include arylamine, pheryls, pyrroles, hydrazones, carbazoles, stilbenes, starburst molecules, and oxadiazoles.

A hole transport layer (HTL) 16 may be optionally formed between the hole injection layer (HIL) 11 and the emissive layer 12.

The material for the hole transport layer (HTL) 16 is not particularly limited, but may be selected from a compound having a carbazole group and/or an arylamine group, which transport holes, a phthalocyanine-based compound, and a triphenylene derivative. More particularly, the hole transport layer (HTL) 16 may be composed of at least one material selected from the group consisting of 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine(TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine (NPB), IDE320 (Idemitsu Kosan Co., LTD.), poly(9,9-dioctylfluorene-co-N-(4-butylphenyl) diphenylamine (TFB), and poly(9,9-dioctylfluorene-co-bis-N,N-phenyl-1,4-phenylenediamine) (PFB), but is not limited thereto.

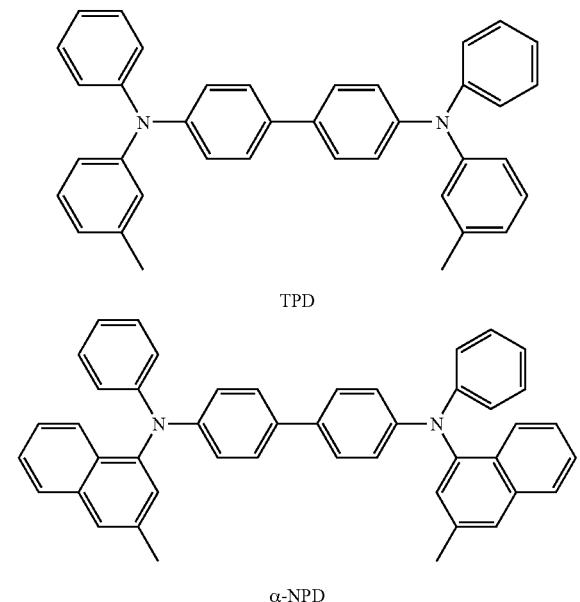

The hole transport layer (HTL) 16 may have a thickness of 1 to 100 nm, preferably 5 to 50 nm, more preferably 30 nm. When the thickness of the hole transport layer (HTL) 16 is less than 1 nm, the hole transport ability can be reduced because the hole transport layer (HTL) 16 is too thin. When the thickness of the hole transport layer (HTL) 16 is greater than 100 nm, driving voltage can be increased.

A hole blocking layer (HBL) 13 and/or an electron transport layer (ETL) 15 can be optionally formed on the emissive layer 12 using a deposition or spin coating method. The hole blocking layer (HBL) 13 prevents migration of excitons formed from a light emitting material to the electron transport layer (ETL) 15 or migration of holes to the electron transport layer (ETL) 15.

The hole blocking layer (HBL) 13 may be composed of phenanthrolines (e.g., BCP available from UDC), imidazoles, triazoles, oxadiazoles (e.g., PBD), aluminium complex (available from UDC), or aluminum(III)bis(2-methyl-8-quinolinato)$_4$-phenylphenolate (BAlq) having the following structures:

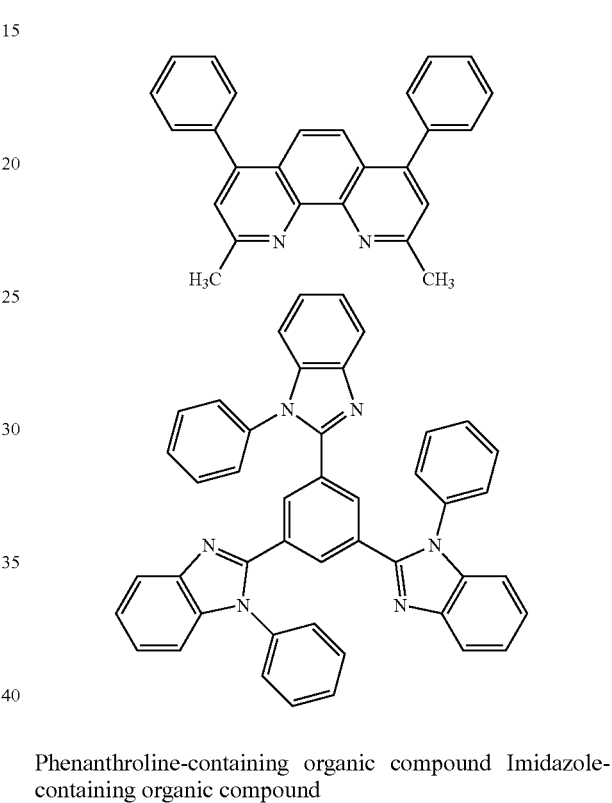

Phenanthroline-containing organic compound Imidazole-containing organic compound

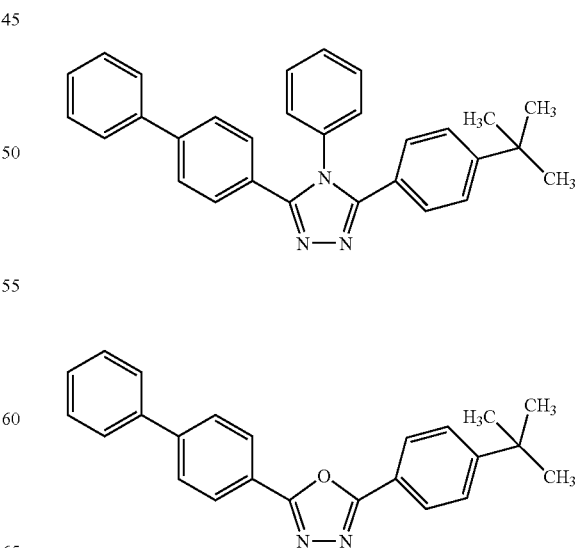

Triazole-containing organic compound oxadiazole-containing compound

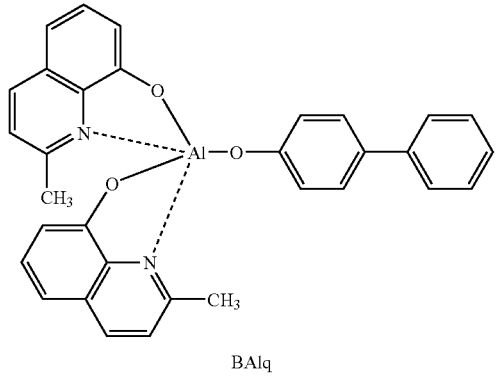

BAlq

The electron transport layer (ETL) 15 may be composed of oxazoles, isoxazoles, triazoles, isothiazoles, oxadiazoles, thiadiazoles, perylenes, aluminium complexes (e.g., Alq3 (tris(8-quinolinolato)-aluminium), BAlq, SAlq, Almq3), gallium complexes (e.g., Gaq'2OPiv, Gaq'2OAc, 2(Gaq'2)).

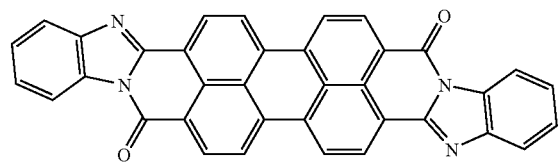

Perylene-based compound

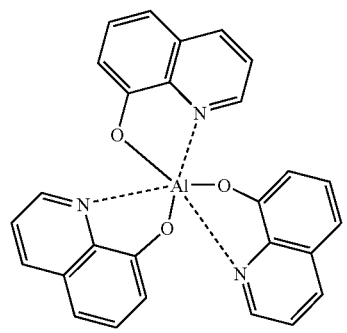

Alq3

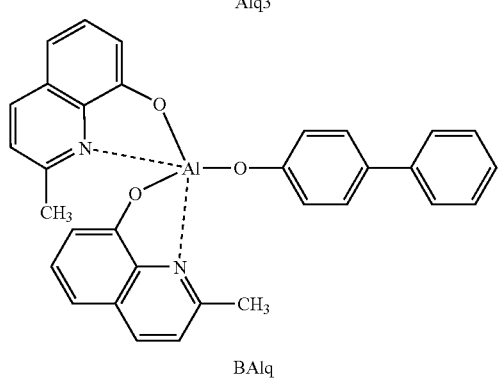

BAlq

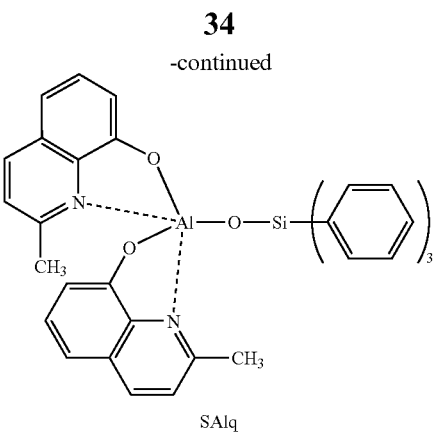

SAlq

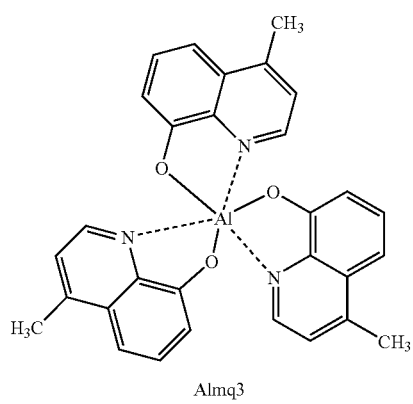

Almq3

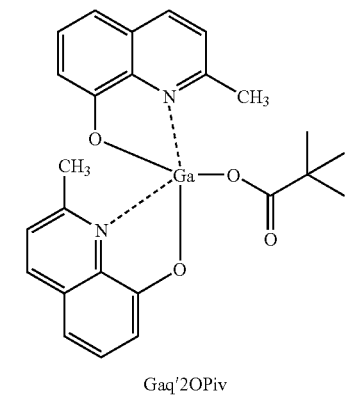

Gaq'2OPiv

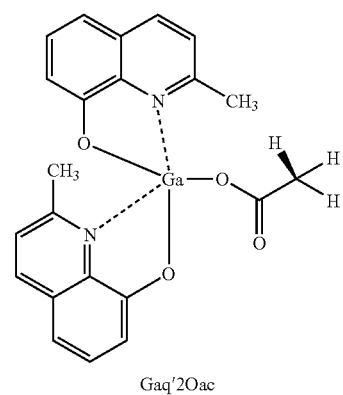

Gaq'2Oac

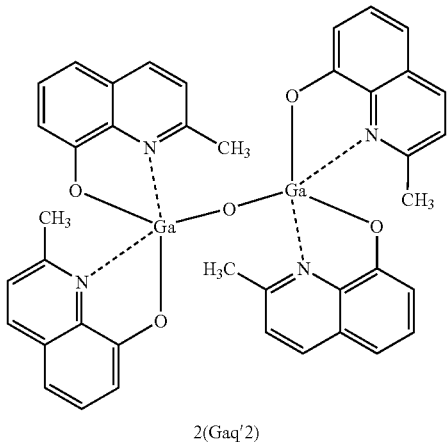

2(Gaq'2)

The thickness of the hole blocking layer (HBL) 13 may be 5 to 100 nm and the thickness of the electron transport layer (ETL) 15 may be 5 to 100 nm. When the thickness of the hole blocking layer (HBL) 13 and the thickness of the electron transport layer (ETL) 15 are not within these ranges, electron transport ability and hole blocking ability are poor.

Next, a second electrode 14 is formed on the resultant and encapsulated to complete the organic light emitting device according to the current embodiment of the present invention.

The material for the second electrode 14 is not particularly limited, but may be a metal having a low work function, i.e., Li, Cs, Ba, Ca, Ca/Al, LiF/Ca, LiF/Al, BaF$_2$/Ca, Mg, Ag, Al, an alloy thereof, or a multilayer structure thereof. The thickness of the second electrode 14 may be 50 to 3,000 Å.

The organic light emitting device according to an embodiment of the present invention does not require a particular apparatus or method for manufacturing it and can be manufactured using a conventional manufacturing method.

Hereinafter, the present invention will now be described in greater detail with reference to the following examples. The following examples are for illustrative purposes only and are not intended to limit the scope of the invention.

PREPARATION EXAMPLE 1

Preparation of PANI Conducting Polymer Composition-1

PSSA-g-PANI (polystyrenesulfonic acid-graft-polyaniline) as a conducting polymer was polymerized using a known synthesis principle [W. J. Bae et al. Chem. Comm., pp 2768-2769, 2003 which is incorporated herein by reference]. The weight ratio of a PSSA polymer chain to a grafted PANI chain was 1 to 0.15. The number-average molecule weight of PSSA-g-PANI was 35,000.

Then, 100 parts by weight of the conducting polymer and 800 parts by weight of the first ionomer of Formula 19 were dissolved in a mixed solution of water and isopropanol to 2.0 wt % to obtain a conducting polymer composition.

[Formula 19]

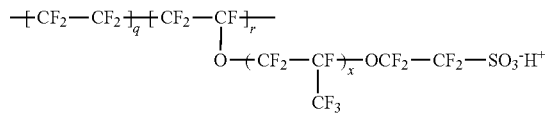

Where q=1,300, r=200, x=1.

PREPARATION EXAMPLE 2

Preparation of PANI Conducting Polymer Composition-2

A conducting polymer composition was manufactured in the same manner as in Preparation Example 1, except that 600 parts by weight of PSS (polystyrenesulfonic acid) with respect to 100 parts by weight of PSSA-g-PANI was further added.

PREPARATION EXAMPLE 3

PPY Conducting Polymer Composition

PSSA-g-PPY (polystyrenesulfonic acid-graft-polypyrrole) as a conducting polymer was polymerized using a known synthesis principle [W. J. Bae et al. Macromolecules, 38, pp 1044-1047, 2005, which is incorporated herein by reference]. The weight ratio of a PSSA polymer chain to a grafted PANI chain was 1 to 0.15. The number-average molecule weight of PSSA-g-PANI was 38,000.

Then, a mixed solute of 100 parts by weight of the conducting polymer and 600 parts by weight of the first ionomer of Formula 8 was dissolved in water resulting in 1.5 wt % of the mixed solute to obtain a conducting polymer composition.

PREPARATION EXAMPLE 4

PEDOT Conducting Polymer Composition

PSSA-g-PEDOT (Polystyrenesulfonic acid-graft-Polyethylenedioxythiophene) as a conducting polymer was polymerized in a similar manner to a known synthesis method [W. J. Bae et al. Macromolecules, 38, pp 1044-1047, 2005, which is incorporated herein by reference], except that ethylenedioxythiophene (EDOT) was used as a monomer. A weight ratio of a PSSA polymer chain to a grafted PEDOT chain was 1 to 0.20. A number-average molecule weight of PSSA-g-PANI was 34,000.

Then, a mixed solute of 100 parts by weight of the conducting polymer and 300 parts by weight of the first ionomer of Formula 8 was dissolved in water resulting in 1.5 wt % of the mixed solute to obtain a conducting polymer composition.

EXAMPLE 1

A 15 Ω/cm$^2$ (150 nm) ITO glass substrate (available from Corning Co.) was cut to a size of 50 mm×50 mm×0.7 mm and was ultrasonically washed in isopropyl alcohol and pure water, respectively, for 5 min, and then washed with UV and ozone for 30 min.

2 wt % of a solution of the PSSA-g-PANI conducting polymer composition prepared in Preparation Example 1 was spin coated on the substrate to form a 50 nm thick HIL. PFB (hole transport material available from Dow Chemical Co.

(Currently Sumitomo Chemical Co.)) was spin coated on the HIL to form a 10 nm thick hole transport layer (HTL).

Polyfluorene-based light emitting polymer (Dow Green K2 available from Dow Chemical Co. (Currently Sumitomo Chemical Co.)), as a blue light emitting material, was used to form an 80 nm thick emissive layer on the hole transport layer (HTL). Then, $BaF_2$ was deposited on the emissive layer to form a 4 nm thick EIL. A 3.5 nm thick Ba layer and a 200 nm thick Al layer were formed on the EIL as a second electrode to complete an organic light emitting device. This organic light emitting device was called Sample 1.

EXAMPLE 2

An organic light emitting device was manufactured in the same manner as in Example 1, except that the conducting polymer composition obtained in Preparation Example 2 was used as a material for the hole injection layer in Example 1. This organic light emitting device was called Sample 2.

COMPARATIVE EXAMPLE

An organic light emitting device was manufactured in the same manner as in Example 1, except that a PEDOT/PSS aqueous solution commercially available as Baytron P VP Al4083 from Bayer Inc. was used as a material for the hole injection layer (HIL). The obtained organic light emitting device was called Sample A.

EVALUATION EXAMPLE 1

Evaluation of Efficiency

Figure 2:
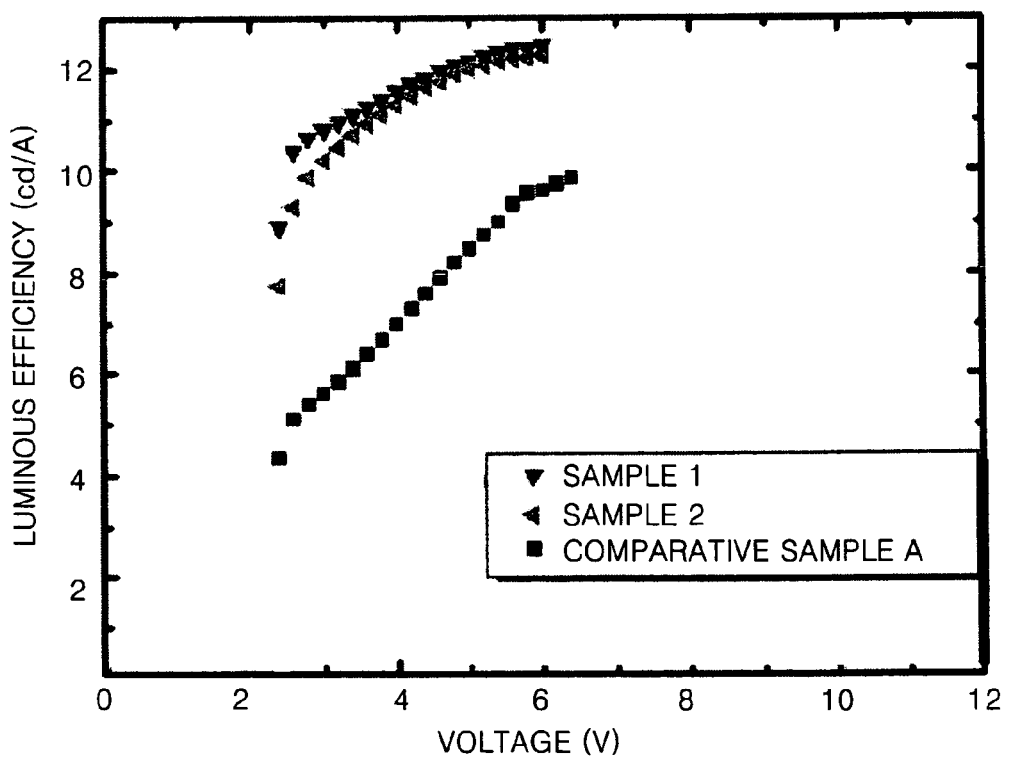
FIG. 2 is a graph of voltage with respect to luminous efficiency of organic light emitting devices manufactured according to an exemplary embodiment and a comparative example.

The efficiency of Sample 1, 2, and Sample A was determined using a SpectraScan PR650 spectroradiometer. The results are shown in FIG. 2.

Sample 1 and 2 exhibited an efficiency of 12.5 cd/A and Sample A exhibited an efficiency of 10 cd/A. Thus, an increase in efficiency of 50% was obtained.

Accordingly, it can be seen that the organic light emitting device having the hole injection layer (HIL) composed of the conducting polymer composition according to an embodiment of the present invention has good luminous efficiency.

EVALUATION EXAMPLE 2

Evaluation of Lifetime

Figure 3:
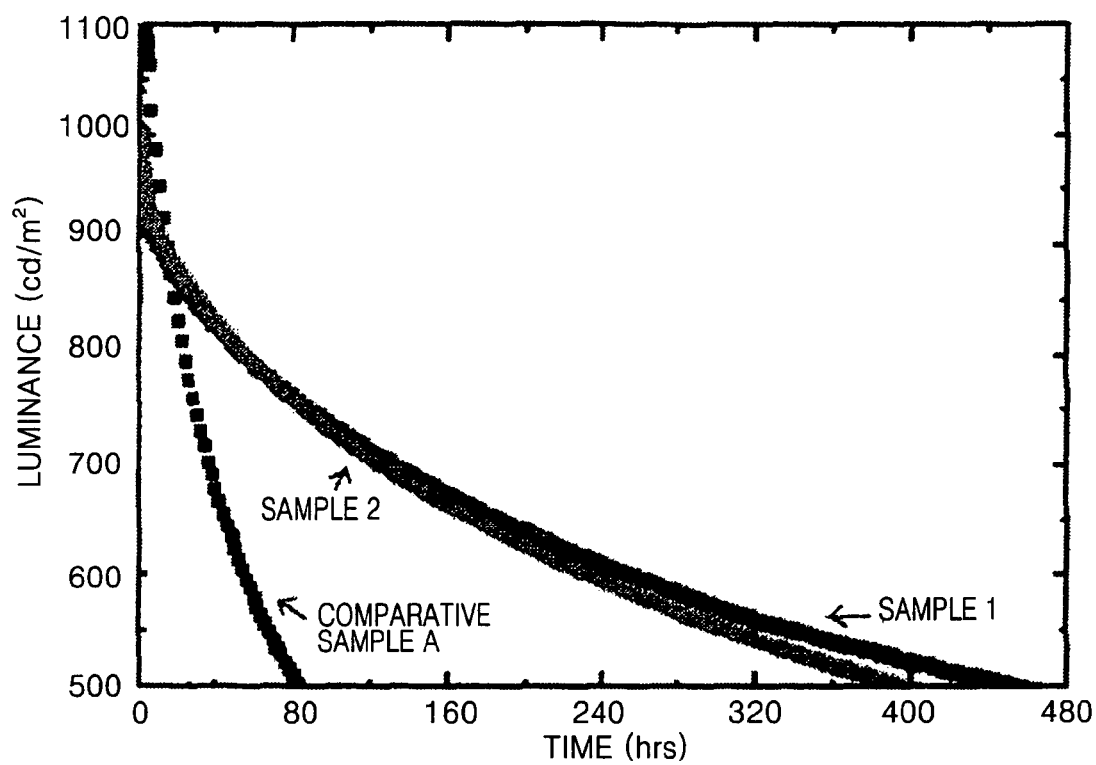
FIG. 3 is a graph of time with respect to luminance of an organic light emitting device manufactured according to an exemplary embodiment and a comparative example.

The lifetime of Sample 1, 2, and Sample A was investigated. The lifetime was determined measuring luminance with respect to time using a photodiode and was represented by a time at which an initial luminance was reduced to 50%. The results are shown in FIG. 3.

Sample 1 and 2 had a lifetime of about 480 and 400 hrs and Sample A had a lifetime of about 80 hrs when they were operated at an initial luminance of 1,100 $cd/m^2$. Thus, the organic light emitting device according to the embodiments of the present invention had a lifetime approximately 500% higher than that of a conventional organic light emitting device.

EVALUATION EXAMPLE 3

Evaluation of Work Function of a Conducting Polymer Film

The conducting polymer composition obtained in Preparation Examples 1 through 4 were spin coated on an ITO substrate to form a thin film having a thickness of 50 nm. Then, the thin film was heated for 5 min at a temperature of 200° C. on a hot plate in air, and then the work function was measured. Each Sample used here is 3, 4, 5, and 6, respectively. Surface Analyzer Model AC2, Photoelectron Spectrometer in air (PESA), manufactured by RIKEN KEIKI, Co. Ltd. was used for evaluation. Values obtained in Samples 3, 4, 5, and 6 are 5.18 eV, 5.24 eV, 5.73 eV, and 5.75 eV, respectively.

Also, PEDOT/PSS (Baytron P VP Al4083) used in Comparative Example 1 was manufactured in the same manner as in Evaluation Example 3 and was called Sample B. Sample B obtained using the same evaluation method as that of Experimental Example 3 had a work function of 5.18 eV.

As can be seen from the results described above, in the thin film formed of the polymer composition obtained according to an embodiment of the present invention as in Evaluation Example 3, the fluoride ionomer moves to the surface of the polymer composition thin film by phase separation, so that it is difficult for electrons to move out of the polymer composition thin film. As a result, the work function increases, and thus holes can be easily injected to the polymer composition thin film.

As described above, the conducting polymer according to the embodiments of the present invention is a self-doped conducting polymer in which conducting polymer chains are grafted in a polyacid, and the conducting polymer composition according to the embodiments of the present invention is manufactured by blending the self-doped conducting polymer with an ionomer having a physical cross-linking property thereto, and thus is homogeneously dissolved in water or organic solvents. As a result, the conducting polymer and the composition has a good film-forming property and can be easily blended with other organic polymers, and conductivity and a work function thereof is easily controlled according to the content of an ionomer. Optoelectronic devices including the conducting polymer composition have high efficiency and a long lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting device, comprising:
a first electrode;
a second electrode; and
an organic layer interposed between the first electrode and the second electrode, the organic layer comprising an electron injection layer comprising a conducting film comprising a conducting polymer having a repeating unit represented by Formula 1 and a degree of polymerization of 10 to 10,000,000:

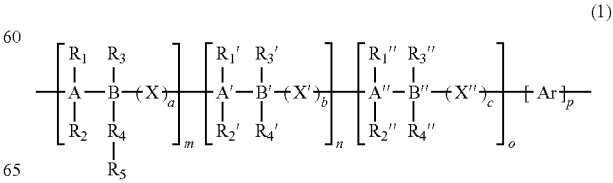

(1)

where $0 < m < 10,000,000$, $0 < n < 10,000,000$, $0 \leq o < 10,000,000$, $0 \leq p < 10,000,000$, $0 \leq a \leq 20$, $0 \leq b \leq 20$, $0 \leq c \leq 20$, and $10 \leq m+n+o+p \leq 10,000,000$;

each of A, B, A', B', A", and B" is independently selected from the group consisting of C, Si, Ge, Sn, and Pb;

each of $R_1$, $R_2$, $R_3$, $R_1'$, $R_2'$, $R_3'$, $R_4'$, $R_1"$, $R_2"$, $R_3"$, and $R_4"$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 alkylaryl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C6-C30 heteroarylester group;

at least one of $R_1$, $R_2$, $R_3$, $R_1'$, $R_2'$, $R_3'$ and $R_4'$ is an ionic group or comprises an ionic group;

each of $R_4$, X, and X' is independently selected from the group consisting of a single bond, O, S, a substituted or unsubstituted C1-C30 alkylene group, a substituted or unsubstituted C1-C30 iminoalkylene group, a substituted or unsubstituted C1-C30 heteroalkylene group, a substituted or unsubstituted C6-C30 arylene group, a substituted or unsubstituted C6-C30 iminoarylene group, a substituted or unsubstituted C6-C30 arylalkylene group, a substituted or unsubstituted C6-C30 alkylarylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group, and a substituted or unsubstituted C6-C30 heteroarylester group;

$R_5$ is selected from the group consisting of polyaniline, polypyrrole, polyethylenedioxythiophene, polythiophene, polyphenylene, polyacetylene, polyphenylenevinylene and derivatives thereof having a degree of polymerization of 2 to 10,000,000; and Ar is selected from structural formulas represented by Formulas 1A through 1AA;

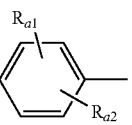
(1A)

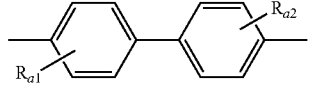
(1B)

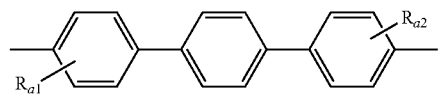
(1C)

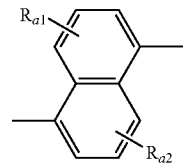
(1D)

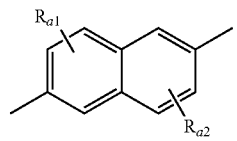
(1E)

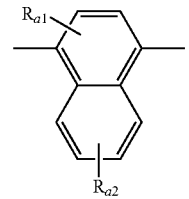
(1F)

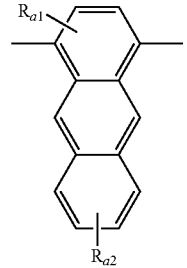
(1G)

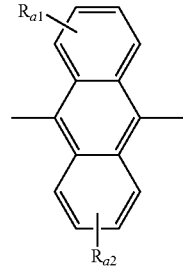
(1H)

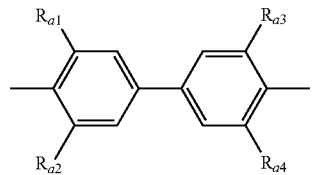
(1I)

(1J) 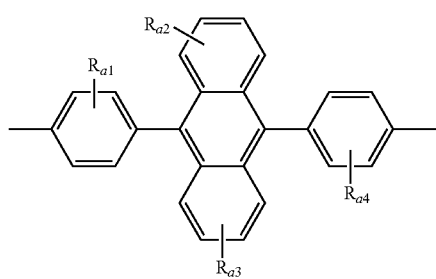
(1K) 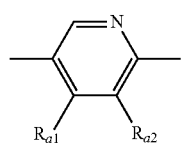
(1L) 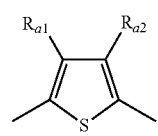
(1M) 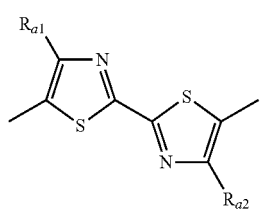
(1N) 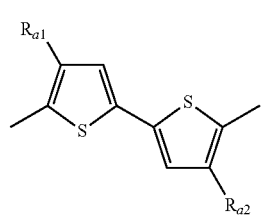
(1O) 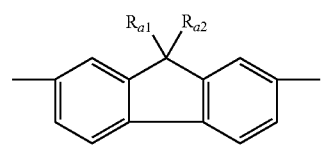
(1P) 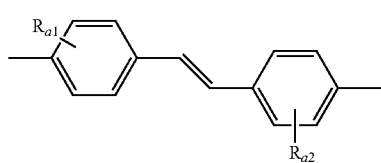
(1Q) 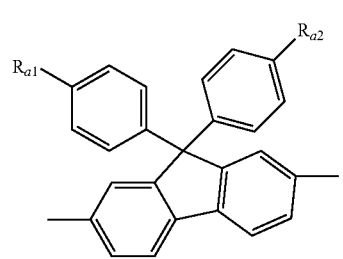
(1R) 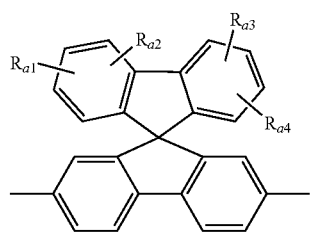
(1S) 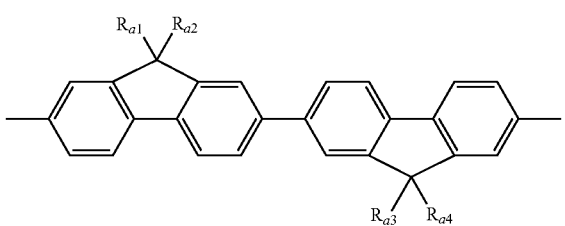
(1T) 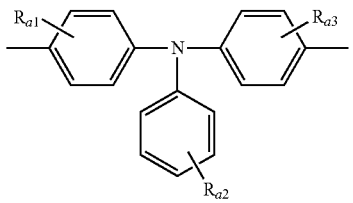
(1U) 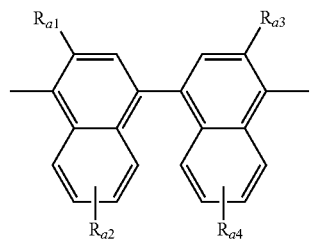
(1V) 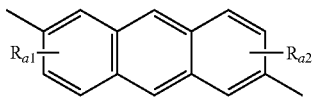
(1W) 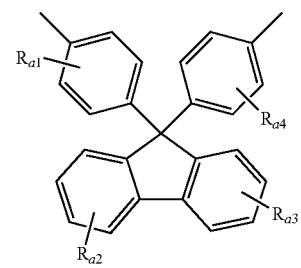
(1X) 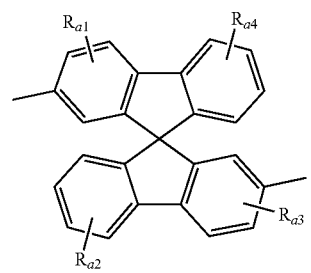

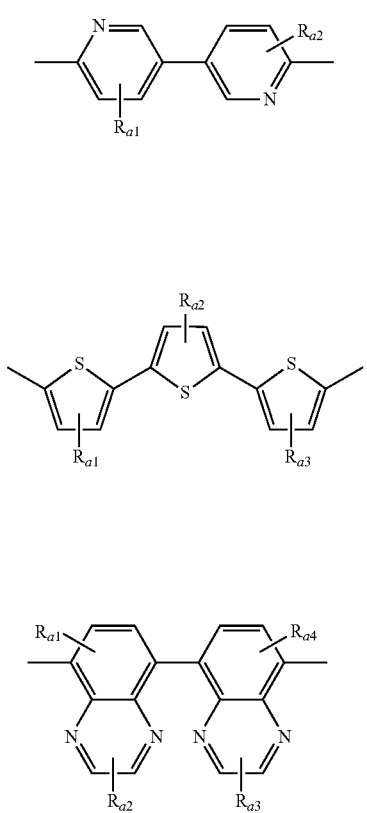

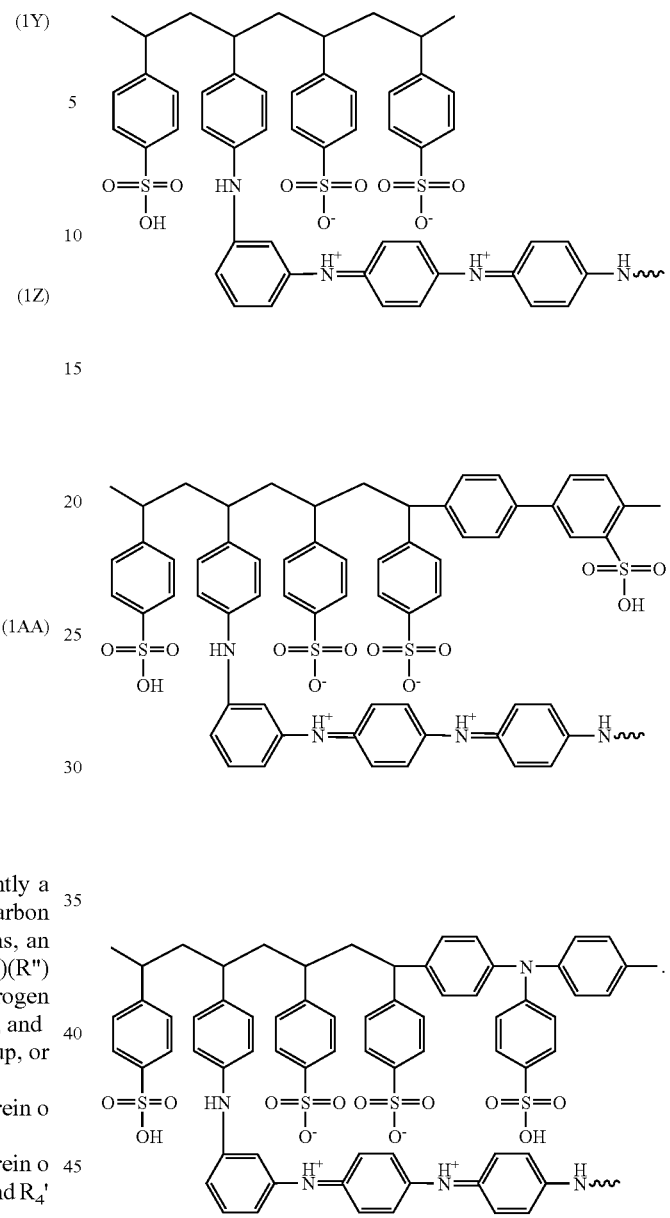

where each of $R_{a1}$, $R_{a2}$, $R_{a3}$ and $R_{a4}$ is independently a hydrogen atom, an alkyl group having 1-12 carbon atoms, an alkoxy group having 1-12 carbon atoms, an aryl group having 6-20 carbon atoms, or —N(R')(R") where each of R' and R" is independently a hydrogen atom or an alkyl group having 1-12 carbon atoms; and at least one of $R_{a1}$, $R_{a2}$, $R_{a3}$ and $R_{a4}$ is an ionic group, or comprises an ionic group.

2. The organic light emitting device of claim 1, wherein o is in the range of $0.001 < o/(m+n+o+p) < 0.99$.

3. The organic light emitting device of claim 1, wherein o is 0, and at least one of $R_1$, $R_2$, $R_3$, $R_4$, $R_5$, $R_1'$, $R_2'$, $R_3'$, and $R_4'$ includes at least one fluorine atom.

4. The organic light emitting device of claim 1, wherein o is 0, and m is in the range of $0.001 < m/(m+n+p) < 0.99$.

5. The organic light emitting device of claim 1, wherein p is in the range of $0.001 < p/(m+n+o+p) < 0.99$.

6. The organic light emitting device of claim 1, wherein p is 0, and m is in the range of $0.001 < m/(m+n+o) < 0.99$.

7. The organic light emitting device of claim 1, wherein the conducting polymer has the repeating unit of Formula 1 in which each of A, B, A', B', A", and B" is a carbon atom; each of $R_1$, $R_2$, $R_3$, $R_1'$, $R_2'$, and $R_3'$ is a hydrogen atom; $R_4$ is an aminophenylene group; $R_4'$ is a sulfate phenyl group; $R_5$ is polyaniline having a degree of polymerization of 2 to 10,000,000; X, X' and X" are single bonds; $R_1"$, $R_2"$ and $R_3"$ are hydrogen atoms; $R_4"$ is a substituted or unsubstituted phenyl group; a, b, and c are 0; $0<m<10,000,000$; $0<n<10,000,000$; $0<o<10,000,000$; and $0 \leq p<10,000,000$.

8. The organic light emitting device of claim 7, wherein the conducting polymer is represented by one of the following Formulae:

9. The organic light emitting device of claim 1, wherein the conducting polymer has the repeating unit of Formula 1 in which each of A, B, A', B', A", and B" is a carbon atom; each of $R_1$, $R_2$, $R_3$, $R_1'$, $R_2'$, and $R_3'$ is a hydrogen atom; $R_4$ is methylenephenylene; $R_5$ is polypyrrole having a degree of polymerization of 2 to 10,000,000; X, X' and X" are single bonds; $R_1"$, $R_2"$ and $R_3"$ are hydrogen atoms; $R_4"$ is a substituted or unsubstituted phenyl group; a, b, and c are 0; $0<m<10,000,000$; $0<n<10,000,000$; $0<o<10,000,000$; and $0 \leq p<10,000,000$.

10. The organic light emitting device of claim 9, wherein the conducting polymer is represented by the following Formula:

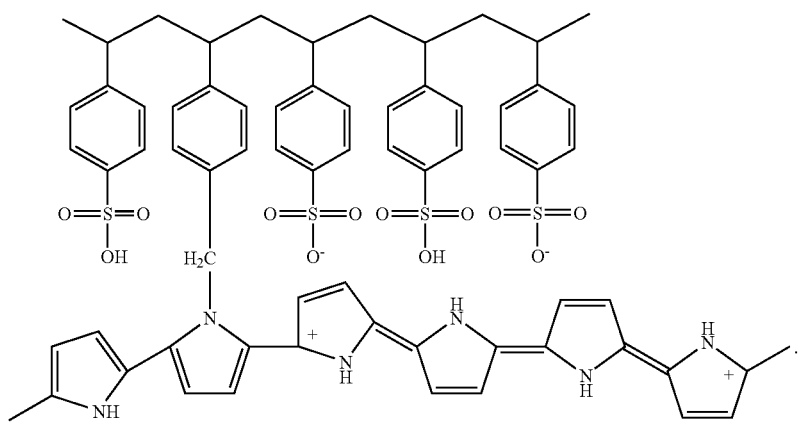

11. The organic light emitting device of claim 1, wherein the conducting polymer has the repeating unit of Formula 1 in which each of A, B, A', B', A", and B" is a carbon atom; each of $R_1$, $R_2$, $R_3$, $R_1'$, $R_2'$, $R_3'$, and $R_4'$ is a hydrogen atom, $R_4$ is a methylphenylene group; $R_5$ is polyethylenedioxythiophene having a degree of polymerization of 2 to 10,000,000; X, X' and X" are single bonds; a, b, and c are 0; each of $R_1''$, $R_2''$ and $R_3''$ is a hydrogen atom; $R''_4$ is a substituted or unsubstituted phenyl group; a, b, and c are 0; 0<m<10,000,000; 0<n<10,000,000; 0<o<10,000,000; and 0≦p<10,000,000.

12. The organic light emitting device of claim 11, wherein the conducting polymer is represented by the following Formula:

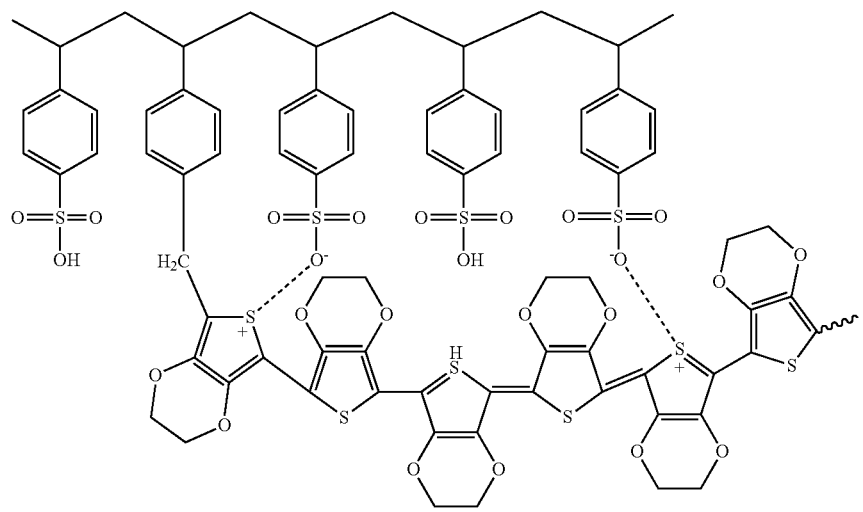

13. The organic light emitting device of claim 1, wherein the ionic group comprises an anion selected from the group consisting of $PO_3^{2-}$, $SO_3^-$, $COO^-$, $I^-$, and $CH_3COO^-$, and a cation paired with the anion and selected from the group consisting of $Na^+$, $K^+$, $Li^+$, $Mg^{+2}$, $Zn^{+2}$, $Al^{+3}$, $H^+$, $NH_4^+$, and $CH_3(CH_2)_nO^+$ in which n is an integer in the range of 0 to 50.

14. The organic light emitting device of claim 1, wherein the conducting polymer having the repeating unit of Formula 1 is represented by Formulas 2A through 2C:

(2A)

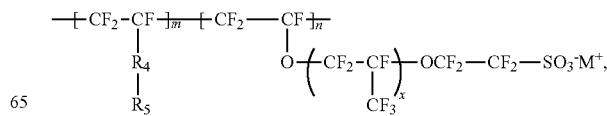

-continued

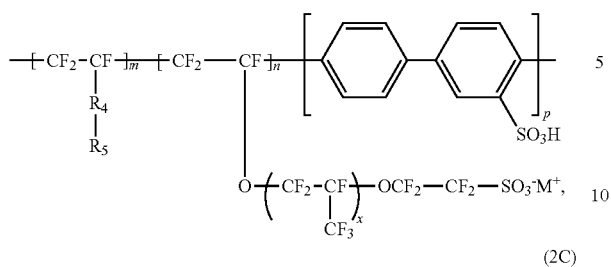

(2B)

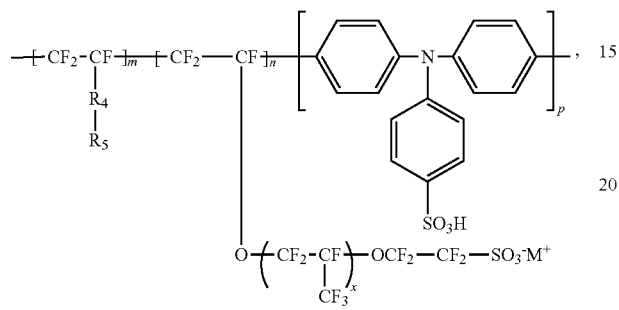

(2C)

where $0<m<10,000,000$, $0<n<10,000,000$, $0<p<10,000,000$, $0<x<10,000,000$, M is a hydrogen atom or sodium; and $R_4$ is selected from the group consisting of a single bond, O, S, a substituted or unsubstituted C1-C30 alkylene group, a substituted or unsubstituted C1-C30 iminoalkylene group, a substituted or unsubstituted C1-C30 heteroalkylene group, a substituted or unsubstituted C6-C30 arylene group, a substituted or unsubstituted C6-C30 iminoarylene group, a substituted or unsubstituted C6-C30 arylalkylene group, a substituted or unsubstituted C6-C30 alkylarylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group and a substituted or unsubstituted C6-C30 heteroarylester group; and $R_5$ is polyaniline, polypyrrole, or polyethylenedioxythiophene having a degree of polymerization of 2 to 10,000,000.

15. An organic light emitting device, comprising:
a first electrode;
a second electrode; and
an organic layer interposed between the first electrode and the second electrode, the organic layer comprising an electron injection layer comprising a conducting polymer having a repeating unit represented by Formula 1 and a degree of polymerization of 10 to 10,000,000:

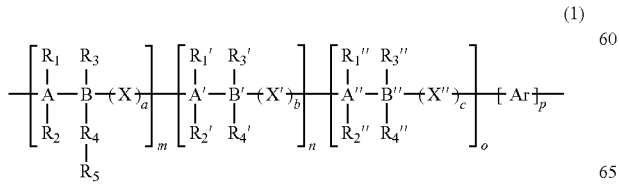

(1)

where $0<m<10,000,000$, $0<n<10,000,000$, $0\leq o<10,000,000$, $0\leq p<10,000,000$, $0\leq a\leq 20$, $0\leq b\leq 20$, $0\leq c\leq 20$, and $10\leq m+n+o+p\leq 10,000,000$;

each of A, B, A', B', A", and B" is independently selected from the group consisting of C, Si, Ge, Sn, and Pb;

each of $R_1$, $R_2$, $R_3$, $R_1'$, $R_2'$, $R_3'$, $R_4'$, $R_1''$, $R_2''$, $R_3''$, and $R_4''$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 alkylaryl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C6-C30 heteroarylester group;

at least one of $R_1$, $R_2$, $R_3$, $R_1'$, $R_2'$, $R_3'$ and $R_4'$ is an ionic group or comprises an ionic group;

each of $R_4$, X, and X' is independently selected from the group consisting of a single bond, O, S, a substituted or unsubstituted C1-C30 alkylene group, a substituted or unsubstituted C1-C30 iminoalkylene group, a substituted or unsubstituted C1-C30 heteroalkylene group, a substituted or unsubstituted C6-C30 arylene group, a substituted or unsubstituted C6-C30 iminoarylene group, a substituted or unsubstituted C6-C30 arylalkylene group, a substituted or unsubstituted C6-C30 alkylarylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group, and a substituted or unsubstituted C6-C30 heteroarylester group;

$R_5$ is selected from the group consisting of polyaniline, polypyrrole, polyethylenedioxythiophene, polythiophene, polyphenylene, polyacetylene, polyphenylenevinylene and derivatives thereof having a degree of polymerization of 2 to 10,000,000; and Ar is selected from structural o ulas represented by Formulas 1A through 1AA;

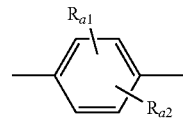

(1A)

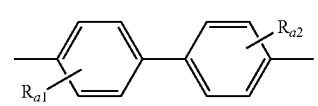

(1B)

-continued
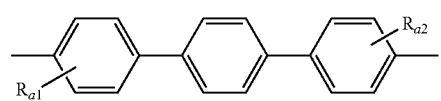
(1C)
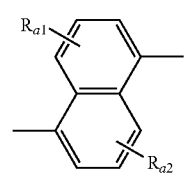
(1D)
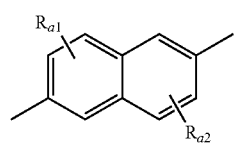
(1E)
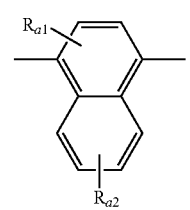
(1F)
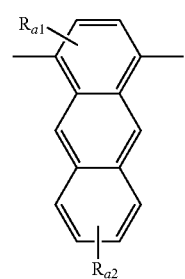
(1G)
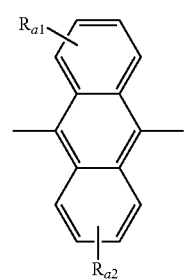
(1H)
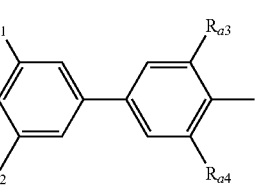
(1I)
-continued
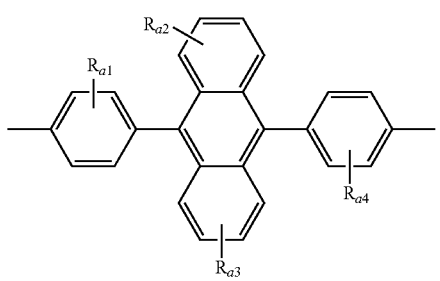
(1J)
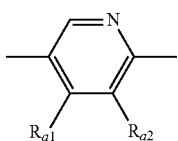
(1K)
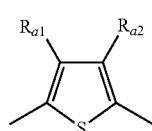
(1L)
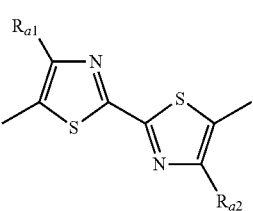
(1M)
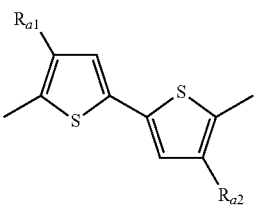
(1N)
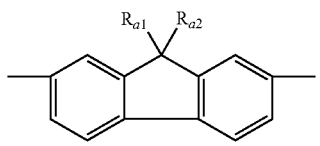
(1O)
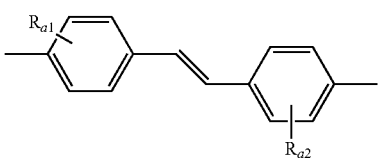
(1P)
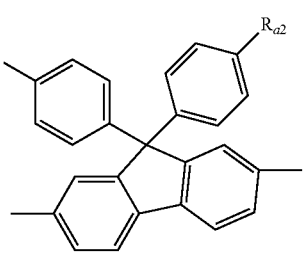
(1Q)

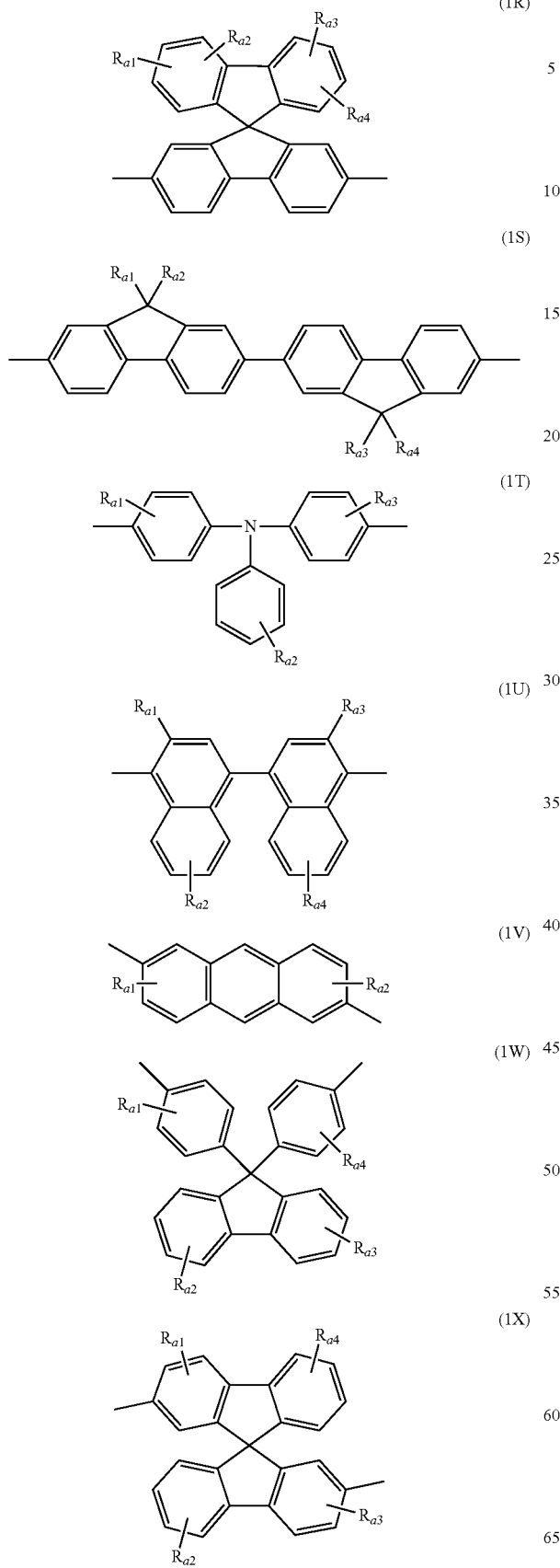

(1R) (1S) (1T) (1U) (1V) (1W) (1X)

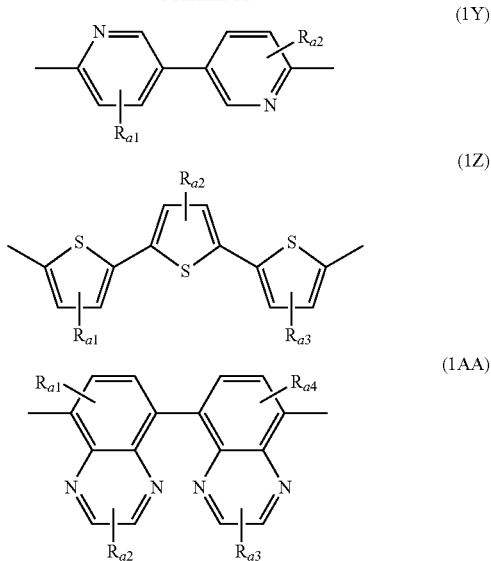

(1Y) (1Z) (1AA)

where each of $R_{a1}$, $R_{a2}$, $R_{a3}$ and $R_{a4}$ is independently a hydrogen atom, an alkyl group having 1-12 carbon atoms, an alkoxy group having 1-12 carbon atoms, an aryl group having 6-20 carbon atoms, or —N(R')(R") where each of R' and R" is independently a hydrogen atom or an alkyl group having 1-12 carbon atoms; and at least one of $R_{a1}$, $R_{a2}$, $R_{a3}$ and $R_{a4}$ is an ionic group, or comprises an ionic group; and a first ionomer having a repeating unit represented by Formula 3 and a degree of polymerization of 10 to 10,000,000:

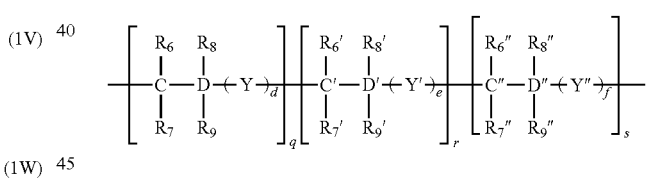

(3)

where $0 \leq q < 10,000,000$, $0 \leq r < 10,000,000$, $0 \leq s < 10,000,000$, $0 \leq d \leq 20$, $0 \leq e \leq 20$, $0 \leq f \leq 20$, and $10 \leq q+r+s \leq 10,000,000$;

each of C, D, C', D', C" and D" is independently C, Si, Ge, Sn, or Pb;

each of $R_6$, $R_7$, $R_8$, $R_9$, $R_6'$, $R_7'$, $R_8'$, $R_9'$, $R_6''$, $R_7''$, $R_8''$, and $R_9''$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group and a substituted or unsubstituted C6-C30 heteroarylester group;

at least one of $R_6$, $R_7$, $R_8$, $R_9$, $R_6'$, $R_7'$, $R_8'$, and $R_9'$ is an ionic group, or comprises an ionic group; and each of Y, Y', and Y" is independently selected from the group consisting of a single bond, O, S, a substituted or unsubstituted C1-C30 alkylene group, a substituted or unsubstituted C1-C30 heteroalkylene group, a substituted or unsubstituted C6-C30 arylene group, a substituted or unsubstituted C6-C30 arylalkylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group and a substituted or unsubstituted C6-C30 heteroarylester group.

16. The organic light emitting device of claim 15, wherein the content of the first ionomer having the repeating unit represented by Formula 3 is 0.01 to 5,000 parts by weight based on 100 parts by weight of the conducting polymer having the repeating unit represented by Formula 1.

17. The organic light emitting device of claim 15, wherein the first ionomer has the repeating unit of Formula 3 where q=1, r=1, and s=0, and is a hydrocarbon-based polymer, a fluorocarbon-based polymer, or a silicon-based polymer.

18. The organic light emitting device of claim 15, wherein the first ionomer having the repeating unit of Formula 3 is a perfluorinated ionomer.

19. The organic light emitting device of claim 15, wherein the ionic group comprises an anion selected from the group consisting of $PO_3^{2-}$, $SO_3^-$, $COO^-$, $I^-$, and $CH_3COO^-$, and a cation paired with the anion and selected from the group consisting of $Na^+$, $K^+$, $Li^+$, $Mg^{+2}$, $Zn^{+2}$, and $Al^{+3}$, $H^+$, $NH_4^+$, and $CH_3(CH_2)_nO^+$ in which n is an integer in the range of 0 to 50.

20. The organic light emitting device of claim 15, wherein the first ionomer having the repeating unit of Formula 3 is a compound represented by one of Formulas 4 through 18:

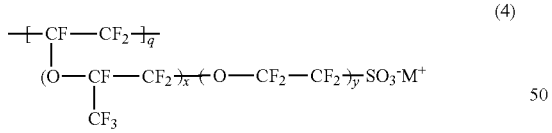

(4)

where q is 10 to 10,000,000, each of x and y is independently an integer in the range of 0 to 10, and $M^+$ is $Na^+$, $K^+$, $Li^+$, $H^+$, $CH_3(CH_2)_n NH_3^+$ where n is an integer in the range of 0 to 50, $NH_4^+$, $NH_2^+$, $NHSO_2CF_3^+$, $CHO^+$, $C_2H_5OH^+$, $CH_3OH^+$, and $RCHO^+$ where R is an alkyl group, i.e., $CH_3(CH_2)_n^-$; n is an integer in the range of 0 to 50;

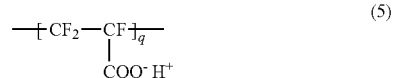

(5)

where q is 10 to 10,000,000;

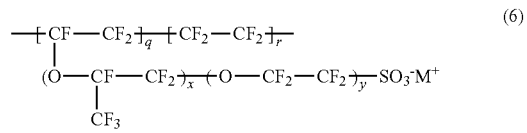

(6)

where $0<q\leq10,000,000$, $0\leq r<10,000,000$, $10\leq q+r\leq10,000,000$, each of x and y is independently an integer in the range of 0 to 20, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $CH_3(CH_2)_n^-$; n is an integer in the range of 0 to 50;

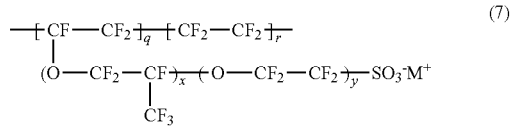

(7)

where $0<q\leq10,000,000$, $0\leq r<10,000,000$, $10\leq q+r\leq10,000,000$, each of x and y is independently an integer in the range of 0 to 20, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $CH_3(CH_2)_n^-$; n is an integer in the range of 0 to 50;

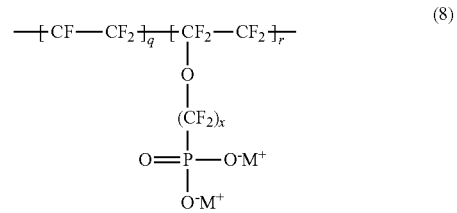

(8)

where $0<q\leq10,000,000$, $0\leq r\leq10,000,000$, $10\leq q+r\leq10,000,000$, x is an integer in the range of 0 to 20, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $CH_3(CH_2)_n^-$; n is an integer in the range of 0 to 50;

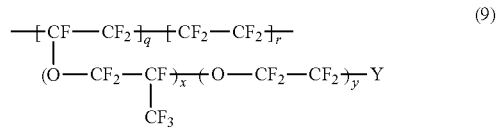

(9)

where $0<q\leq10,000,000$, $0\leq r<10,000,000$, $10\leq q+r\leq10,000,000$, each of x and y is independently an integer in the range of 0 to 20, Y is selected from the group consisting of $—SO_3^- M^+$, $—COO^+M^+$, $—SO_3^-NHSO_2CF_3^+$, and $—PO_3^{2-}(M^+)_2$, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $C_3(CH_2)_n^-$; n is an integer in the range of 0 to 50;

(10)

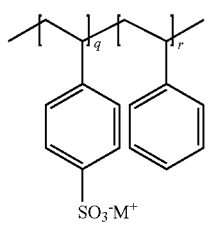

where $0 < q \leq 10{,}000{,}000$, $0 \leq r < 10{,}000{,}000$, $10 \leq q+r \leq 10{,}000{,}000$, and $M^+$ is $Na^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $CH_3(CH_2)_n^-$; n is an integer in the range of 0 to 50;

(11)

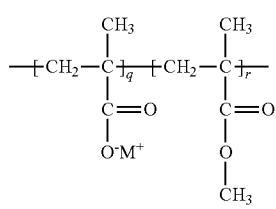

where $0 < q \leq 10{,}000{,}000$, $0 \leq r < 10{,}000{,}000$, $10 \leq q+r \leq 10{,}000{,}000$, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $CH_3(CH_2)_n^-$; n is an integer in the range of 0 to 50;

(12)

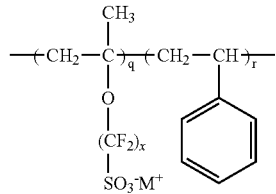

where $0 < q \leq 10{,}000{,}000$, $0 \leq r < 10{,}000{,}000$, $10 \leq q+r \leq 10{,}000{,}000$, x is an integer in the range of 0 to 20, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $CH_3(CH_2)_n^-$; n is an integer in the range of 0 to 50;

(13)

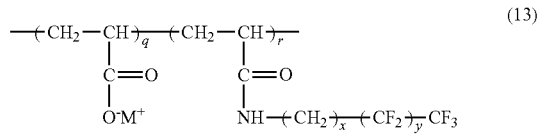

where $0 \leq q \leq 10{,}000{,}000$, $0 \leq r < 10{,}000{,}000$, $10 \leq q+r \leq 10{,}000{,}000$, each of x and y is independently an integer in the range of 0 to 20, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $CH_3(CH_2)_n^-$; n is an integer in the range of 0 to 50;

(14)

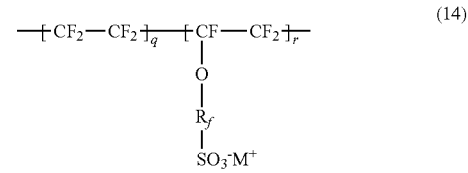

where $0 \leq q < 10{,}000{,}000$, $0 < r \leq 10{,}000{,}000$, $10 \leq q+r \leq 10{,}000{,}000$, $R_f = -(CF_2)_z-$ where z is 1 or an integer in the range of 3 to 50, $-(CF_2CF_2O)_zCF_2CF_2-$ where z is an integer in the range of 1 to 50, and $-(CF_2CF_2CF_2O)_zCF_2CF_2-$ where z is an integer in the range of 1 to 50, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $CH_3(CH_2)_n^-$; n is an integer in the range of 0 to 50;

(15)

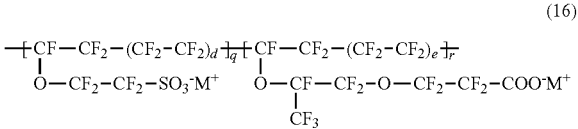

where $0 \leq q < 10{,}000{,}000$, $0 < r \leq 10{,}000{,}000$, $10 \leq q+r \leq 10{,}000{,}000$, each of x and y is independently an integer in the range of 0 to 20, Y is a compound selected from the group consisting of $-SO_3^-M^+$, $-COO^-M^+$, $-SO_3^-NHSO_2CF_3^+$, and $-PO_3^{2-}(M^+)_2$, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $CH_3(CH_2)_n^-$; n is an integer in the range of 0 to 50;

(16)

$$-\!\!\!\left[\!CF\!-\!CF_2\!-\!(CF_2\!-\!CF_2)_d\!\right]_{\!q}\!\!\left[\!CF\!-\!CF_2\!-\!(CF_2\!-\!CF_2)_e\!\right]_{\!r}\!\!-$$
$$\quad\;\, O\!-\!CF_2\!-\!CF_2\!-\!SO_3^-M^+ \quad\; O\!-\!CF\!-\!CF_2\!-\!O\!-\!CF_2\!-\!CF_2\!-\!COO^-M^+$$
$$\qquad\qquad\qquad\qquad\qquad\qquad\qquad\quad\; CF_3$$

where $0 \leq q < 10{,}000{,}000$, $0 < r \leq 10{,}000{,}000$, $10 \leq q+r \leq 10{,}000{,}000$, $0 \leq d \leq 20$, $0 \leq e \leq 20$, and $M^+$ is $Na^+$, $K^+$, $Li^+$, $H^+$, $CH_3(CH_2)_nNH_3^+$ where n is an integer in the range of 0 to 50, $NH_4^+$, $NH_2^+$, $NHSO_2CF_3^+$, $CHO^+$, $C_2H_5OH^+$, $CH_3OH^+$, $RCHO^+$ where R is an alkyl group, i.e., $CH_3(CH_2)_n^-$; n is an integer in the range of 0 to 50;

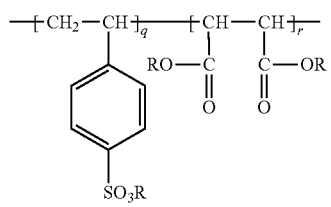

(17)

where $0 \leq q < 10,000,000$, $0 < r \leq 10,000,000$, $10 \leq q+r \leq 10,000,000$, and R is H;

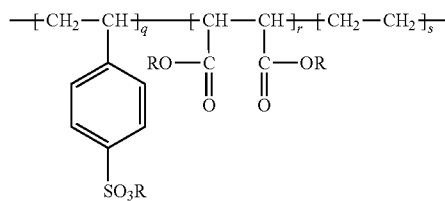

(18)

where $0 \leq q < 10,000,000$, $0 < r \leq 10,000,000$, $0 < s \leq 10,000,000$, $10 \leq q+r+s \leq 10,000,000$, and R is H.

21. The organic light emitting device of claim 15, wherein the conducting polymer composition further comprises at least one second ionomer having the repeating unit of Formula 3 and a degree of polymerization of 10 to 10,000,000, and the first ionomer and the second ionomer are different.

22. The organic light emitting device of claim 21, wherein the second ionomer is a compound represented by Formula 3 and the compound of Formula 3 forming the second ionomer meets further conditions of $10 \leq q < 10,000,000$, r=0 and s=0, and the second ionomer is a hydrocarbon-based polymer, a fluorocarbon-based polymer, or a silicon-based polymer.

23. The organic light emitting device of claim 15, wherein the conducting polymer composition further comprises a physical cross-linking agent, or a chemical cross-linking agent, or both, and wherein the organic layer comprises an interpenetrating polymer network including the conducting polymer of Formula 1 and the ionomer of Formula 3.

24. The organic light emitting device of claim 23, wherein the physical cross-linking agent is selected from the group consisting of glycerol, butanol, polyvinylalcohol, polyethyleneglycol, polyethyleneimine and polyvinylpyrrolidone, and the chemical cross-linking agent is selected from the group consisting of tetraethyloxysilane (TEOS), polyaziridine, melamine and epoxy.

25. The organic light emitting device of claim 15, wherein the conducting polymer composition further comprises nano-sized metal particles, or nano-sized particles of an inorganic compound, or both.

26. An organic light emitting device, comprising:
a first electrode;
a second electrode; and
an organic layer interposed between the first electrode and the second electrode, the organic layer comprising an electron injection layer comprising a conducting polymer having a repeating unit represented by Formula 1 and a degree of polymerization of 10-10,000,000:

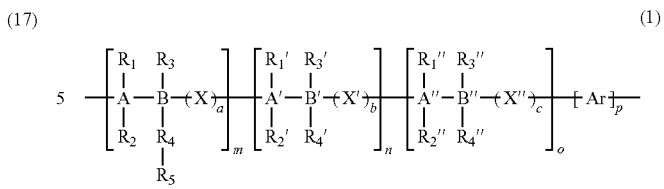

(1)

where $0 < m < 10,000,000$, $0 < n < 10,000,000$, $0 < o < 10,000,000$, $0 \leq p < 10,000,000$, $0 \leq a \leq 20$, $0 \leq b \leq 20$, $0 \leq c \leq 20$, and $10 \leq m+n+o+p \leq 10,000,000$;

each of A, B, A', B', A", and B" is independently selected from the group consisting of C, Si, Ge, Sn, and Pb;

each of $R_1$, $R_2$, $R_3$, $R_1'$, $R_3'$, $R_4'$, $R_1''$, $R_2''$, $R_3''$, and $R_4''$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 alkylaryl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C6-C30 heteroarylester group;

at least one of $R_1$, $R_2$, $R_3$, $R_1'$, $R_2'$, $R_3'$ and $R_4'$ is an ionic group or comprises an ionic group;

each of $R_4$, X, and X' is independently selected from the group consisting of a single bond, O, S, a substituted or unsubstituted C1-C30 alkylene group, a substituted or unsubstituted C1-C30 iminoalkylene group, a substituted or unsubstituted C1-C30 heteroalkylene group, a substituted or unsubstituted C6-C30 arylene group, a substituted or unsubstituted C6-C30 iminoarylene group, a substituted or unsubstituted C6-C30 arylalkylene group, a substituted or unsubstituted C6-C30 alkylarylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group, and a substituted or unsubstituted C6-C30 heteroarylester group;

$R_5$ is selected from the group consisting of polyaniline, polypyrrole, polyethylenedioxythiophene, polythiophene, polyphenylene, polyacetylene, polyphenylenevinylene and derivatives thereof having a degree of polymerization of 2 to 10,000,000; and Ar is selected from structural formulas represented by Formulas 1A through 1AA;

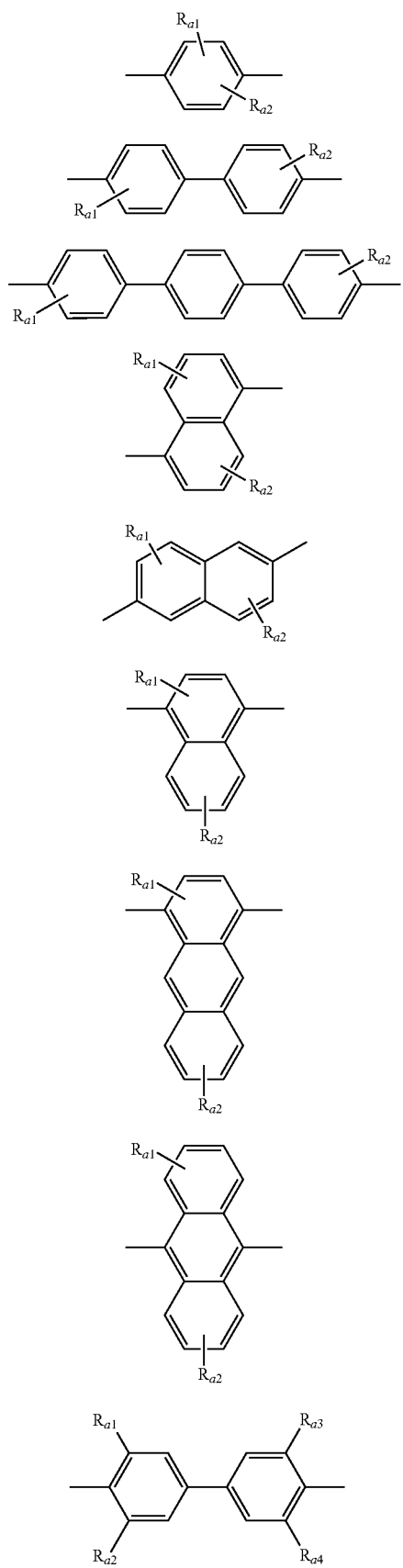
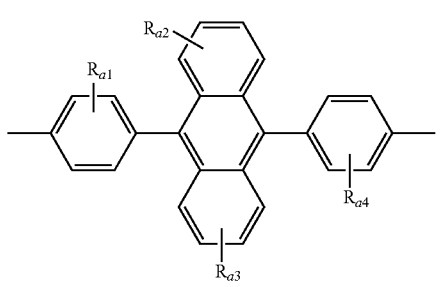
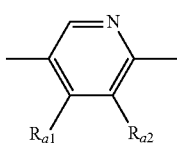
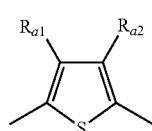
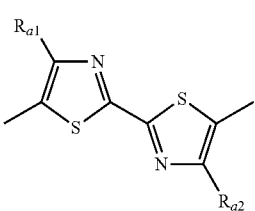
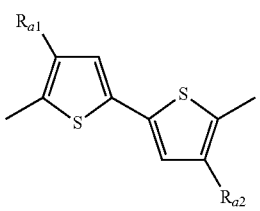
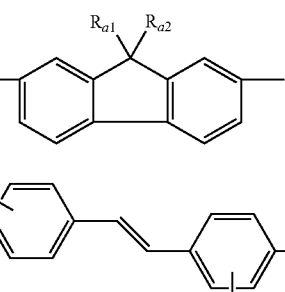
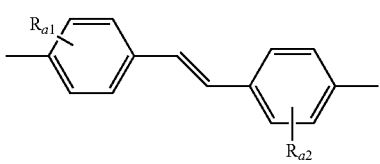
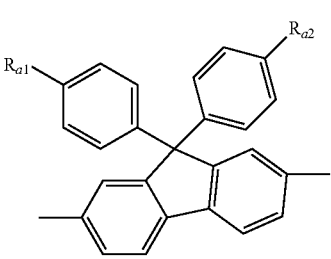

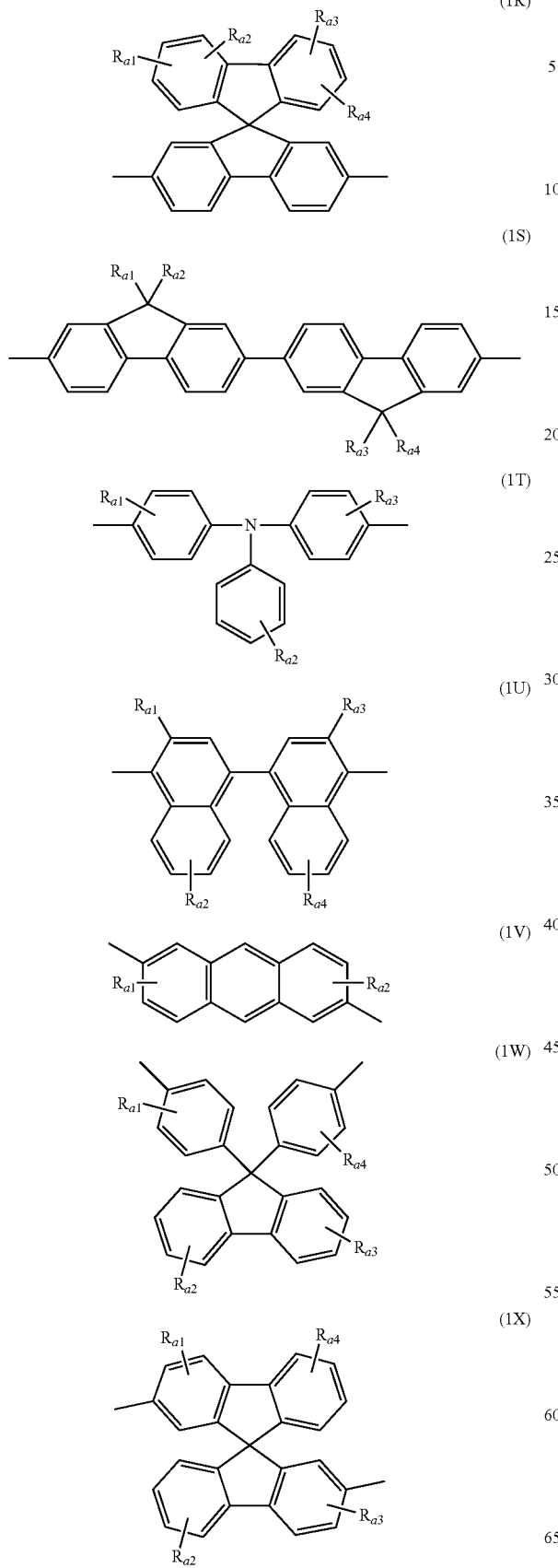

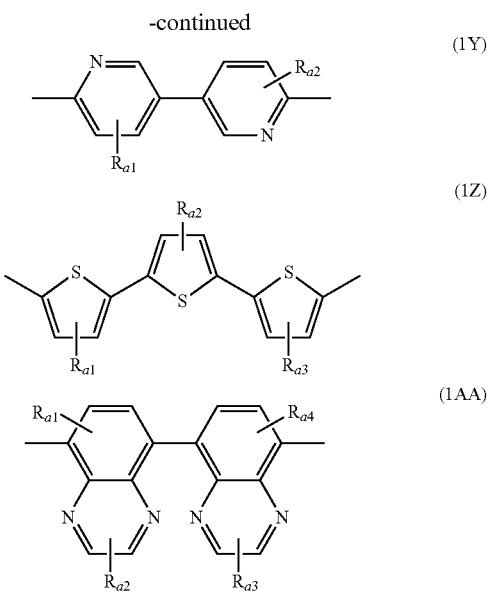

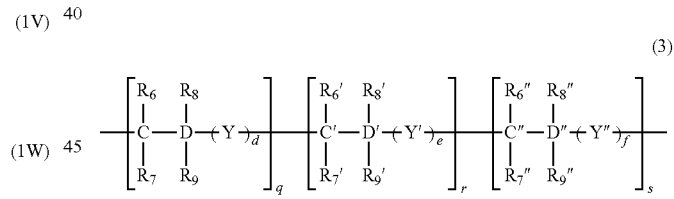

where each of $R_{a1}$, $R_{a2}$, $R_{a3}$ and $R_{a4}$ is independently a hydrogen atom, an alkyl group having 1-12 carbon atoms, an alkoxy group having 1-12 carbon atoms, an aryl group having 6-20 carbon atoms, or —N(R')(R") where each of R' and R" is independently a hydrogen atom or an alkyl group having 1-12 carbon atoms;

at least one of $R_{a1}$, $R_{a2}$, $R_{a3}$ and $R_{a4}$ is an ionic group, or comprises an ionic group; and the monomer units in Formula 1 are different from each other.

27. The organic light emitting device of claim 26, wherein the conducting polymer further comprises a first ionomer having a repeating unit represented by Formula 3 and a degree of polymerization of 10 to 10,000,000:

$$\left[\left[\begin{array}{c}R_6\\|\\C-D\\|\\R_7\end{array}\begin{array}{c}R_8\\|\\|\\R_9\end{array}(Y)_d\right]_q\left[\begin{array}{c}R_6'\\|\\C'-D'\\|\\R_7'\end{array}\begin{array}{c}R_8'\\|\\|\\R_9'\end{array}(Y')_e\right]_r\left[\begin{array}{c}R_6''\\|\\C''-D''\\|\\R_7''\end{array}\begin{array}{c}R_8''\\|\\|\\R_9''\end{array}(Y'')_f\right]_s\right] \quad (3)$$

where $0 \leq q < 10,000,000$, $0 \leq r < 10,000,000$, $0 \leq s < 10,000,000$, $10 \leq q+r+s \leq 10,000,000$, $0 \leq d \leq 20$, $0 \leq e \leq 20$, $0 \leq f \leq 20$;

each of C, D, C', D', C" and D" is independently C, Si, Ge, Sn, or Pb;

each of $R_6$, $R_7$, $R_8$, $R_9$, $R_6'$, $R_7'$, $R_8'$, $R_9'$, $R_6''$, $R_7''$, $R_8''$, and $R_9''$ is independently from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 alkoxy group, a substituted or unsubstituted C6-C30 aryl group, a substituted or unsubstituted C6-C30 arylalkyl group, a substituted or unsubstituted C6-C30 aryloxy group, a substituted or unsubstituted C1-C30 heteroalkyl group, a substituted or unsubstituted C1-C30 heteroalkoxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C5-C30 heterocycloalkyl group, a substituted or unsubstituted C1-C30 alkylester group, a substituted or unsubstituted C1-C30 heteroalkylester group, a substituted or unsubstituted C6-C30 arylester group and a substituted or unsubstituted C6-C30 heteroarylester group;

at least one of $R_6$, $R_7$, $R_8$, $R_9$, $R_6'$, $R_7'$, $R_8'$, and $R_9'$ is an ionic group, or comprises an ionic group; and each of Y, Y', and Y" is independently selected from the group consisting of a single bond, O, S, a substituted or unsubstituted C1-C30 alkylene group, a substituted or unsubstituted C1-C30 heteroalkylene group, a substituted or unsubstituted C6-C30 arylene group, a substituted or unsubstituted C6-C30 arylalkylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C2-C30 heterocycloalkylene group, a substituted or unsubstituted C6-C30 arylester group and a substituted or unsubstituted C6-C30 heteroarylester group.

28. The organic light emitting device of claim 26, wherein the conducting polymer composition further comprises at least one nano-sized metal particles selected from the group consisting of Au, Ag, Cu, Pd, and Pt.

29. The organic light emitting device of claim 1, wherein the conducting polymer composition further comprises at least one nano-sized metal particles selected from the group consisting of Au, Ag, Cu, Pd, and Pt.

30. The organic light emitting device of claim 15, wherein the conducting polymer composition further comprises at least one nano-sized metal particles selected from the group consisting of Au, Ag, Cu, Pd, and Pt.

31. The organic light emitting device of claim 15, wherein the ionomer is substantially located at or near the surface of the organic layer.

* * * * *